US009902866B2

(12) United States Patent
Hersam et al.

(10) Patent No.: US 9,902,866 B2
(45) Date of Patent: *Feb. 27, 2018

(54) METHODS FOR PREPARATION OF CONCENTRATED GRAPHENE INK COMPOSITIONS AND RELATED COMPOSITE MATERIALS

(71) Applicants: Northwestern University, Evanston, IL (US); President and Fellows of Harvard College, Cambridge, MA (US)

(72) Inventors: Mark C. Hersam, Wilmette, IL (US); Yu Teng Liang, Chicago, IL (US); Ethan B. Secor, Evanston, IL (US); Pradyumna L. Prabhumirashi, Chicago, IL (US); Kanan P. Puntambekar, Chicago, IL (US); Michael L. Geier, Chicago, IL (US); Bok Y. Ahn, Cambridge, MA (US); Jennifer A. Lewis, Cambridge, MA (US)

(73) Assignees: Northwestern University, Evanston, IL (US); President and Fellows of Harvard College, Cambridge, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/756,304

(22) Filed: Aug. 24, 2015

(65) Prior Publication Data

US 2017/0081537 A1 Mar. 23, 2017

Related U.S. Application Data

(63) Continuation-in-part of application No. 14/121,097, filed on Jul. 30, 2014, which is a continuation-in-part of application No. 13/453,608, filed on Apr. 23, 2012, now Pat. No. 9,079,764.

(60) Provisional application No. 61/478,361, filed on Apr. 22, 2011.

(51) Int. Cl.
| | |
|---|---|
| H01B 1/04 | (2006.01) |
| C01B 31/02 | (2006.01) |
| C09D 11/38 | (2014.01) |
| B82Y 30/00 | (2011.01) |
| B41J 2/01 | (2006.01) |
| B41M 5/00 | (2006.01) |
| C09D 11/14 | (2006.01) |
| C09D 11/36 | (2014.01) |
| C09D 11/322 | (2014.01) |
| H01L 51/00 | (2006.01) |
| C09D 11/52 | (2014.01) |
| C01B 32/19 | (2017.01) |

(52) U.S. Cl.
CPC ............ C09D 11/38 (2013.01); B41J 2/01 (2013.01); B41M 5/0023 (2013.01); C01B 32/19 (2017.08); C09D 11/14 (2013.01); C09D 11/322 (2013.01); C09D 11/36 (2013.01); C09D 11/52 (2013.01); H01L 51/0005 (2013.01); *C01P 2006/32* (2013.01); *H01L 51/0045* (2013.01)

(58) Field of Classification Search
CPC ........... B41M 5/0023; B41J 2/01; H01B 1/04; H01B 1/24
USPC ........... 252/511, 500, 510; 106/31.13, 31.92; 423/445 R, 448, 460
See application file for complete search history.

(56) References Cited

U.S. PATENT DOCUMENTS

| | | | |
|---|---|---|---|
| 2008/0279756 A1 | 11/2008 | Zhamu et al. | |
| 2010/0000441 A1* | 1/2010 | Jang | C09D 11/037 106/31.13 |
| 2010/0176351 A1 | 7/2010 | Ruoff et al. | |
| 2011/0049437 A1 | 3/2011 | Crain et al. | |
| 2011/0189452 A1 | 8/2011 | Lettow et al. | |
| 2011/0284805 A1 | 11/2011 | Samulski et al. | |
| 2011/0311432 A1 | 12/2011 | Pu et al. | |
| 2015/0072162 A1 | 3/2015 | Hersam et al. | |

FOREIGN PATENT DOCUMENTS

| | | |
|---|---|---|
| CN | 104263082 A | 1/2015 |
| WO | 2010071858 A1 | 6/2010 |
| WO | 2014210584 A1 | 12/2014 |

OTHER PUBLICATIONS

Liang, Y.T. et al., "Highly Concentrated Graphene Solutions via Polymer Enhanced Solvent Exfoliation and Iterative Solvent Exchange", J. Am. Chem. Soc. 2010, 132, 17661-17663.
Secor, E. et al., "Inkjet Printing of High Conductivity, Flexible Graphene Patterns", The Journal of Physical Chemistry Letters, 2013, vol. 4, No. 8, 1347-1351.
International Search Report and Written Opinion for PCT/US2016/048322 dated Nov. 30, 2016, 16 pages.
Hernandez, Y. et al., "High-Yield Production of Graphene by Liquid-Phase Exfoliation of Graphite", Nature Nanotechnology, vol. 3, Sep. 2008, 563-568.
Gao, W. et al., "New Insights into the Structure and Reduction of Graphite Oxide", Nature Chemistry, vol. 1, Aug. 2009, 403-408.
Green, A. et al., "Solution Phase Production of Graphene with Controlled Thickness via Density Differentiation", Nano Letters 2009, vol. 9, No. 12, 4031-4036.
Hernandez, Y., et al., "Measure of Multicompartment Solubility Parameters for Graphene Facilitates Solvent Discovery", Langmuir, 2010, 26 (5), 3208-3213.
Khan et al., "High Concentration solvent exfoliation of graphene." Small, 6(7), pp. 864-871, 2010.

(Continued)

*Primary Examiner* — Tri V Nguyen
(74) *Attorney, Agent, or Firm* — Reinhart Boemer Van Deuren s.c.

(57) ABSTRACT

A rapid, scalable methodology for graphene dispersion and concentration with a polymer-organic solvent medium, as can be utilized without centrifugation, to enhance graphene concentration.

18 Claims, 30 Drawing Sheets
(11 of 30 Drawing Sheet(s) Filed in Color)

(56) References Cited

OTHER PUBLICATIONS

Bourlinos et al., "Aqueous-phase exfoliation of graphite in the presence of polyvinylpyrrolidone for the production of watersoluble graphenes." Solid State Comm, 149, pp. 2172-2176.
Liang et al., "Minimizing Graphene Defects Enhances Titania Nanocomposite-Based Photocatalytic Reduction of $CO_2$ for Improved Solar Fuel Production." Nanoletters, 11, pp. 2865-2870, Jun. 20, 2011.
Yang et al., "Fabrication of High-Concentration and Stable Aqueous Suspensions of Graphene Nanosheets by Noncovalent Functionalization with Lignin and Cellulose Derivatives." JPC C, 114, pp. 3811-3816.

* cited by examiner

Figure 1
Figure 1A
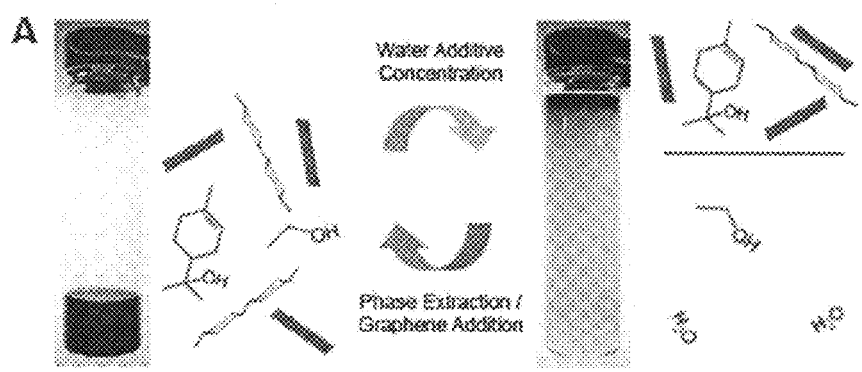
Figure 1B
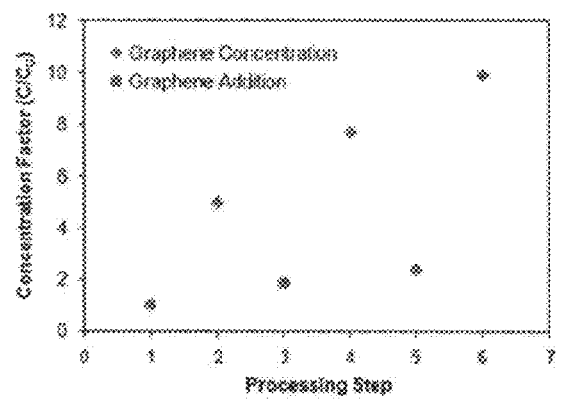

Figure 2A
Figure 2B
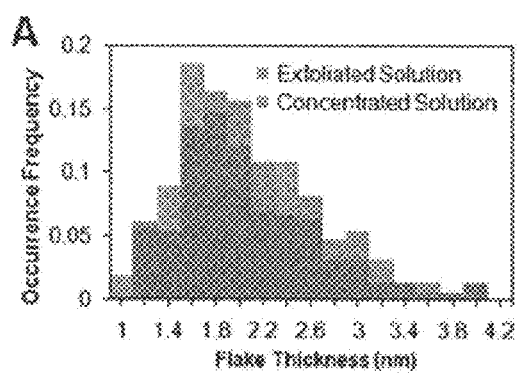
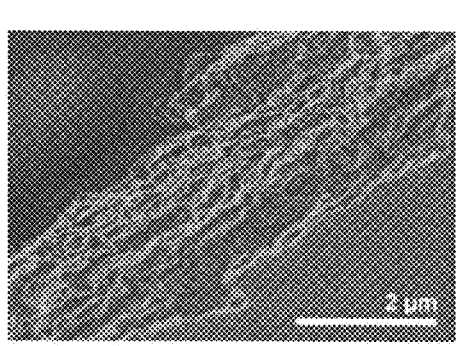
Figure 2C
Figure 2D
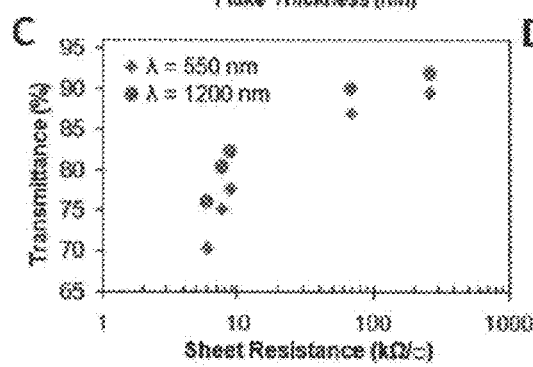
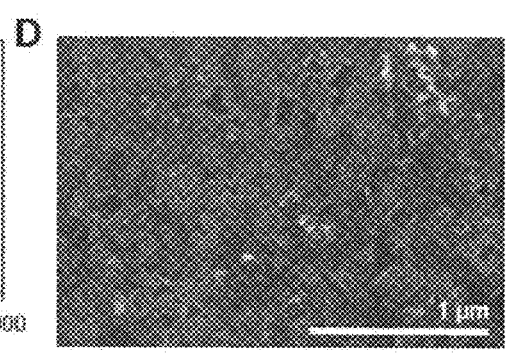

Figure 10A
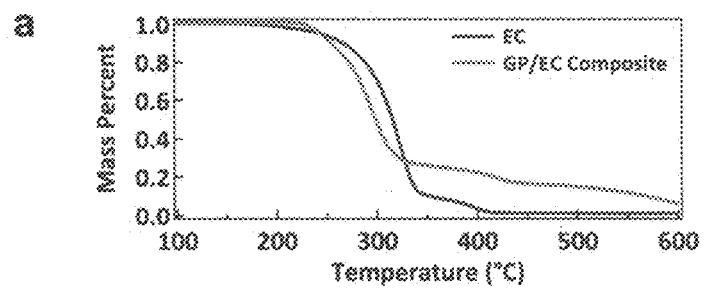
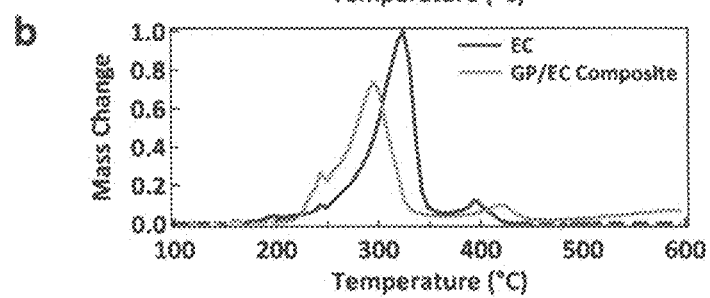
Figure 10B

Figure 16A        Figure 16B        Figure 16C
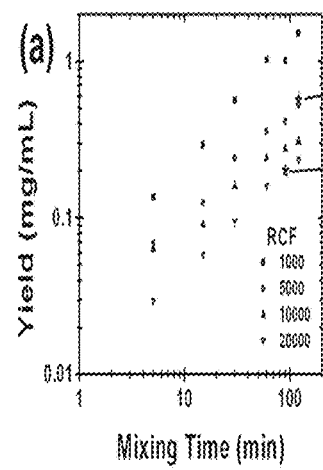 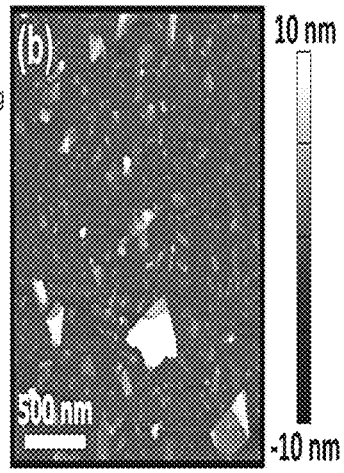 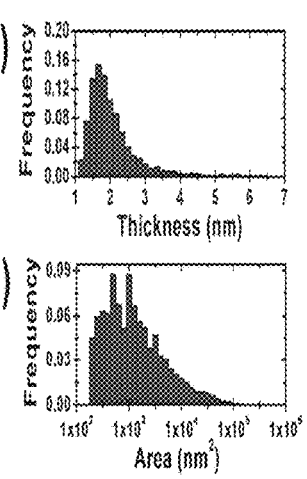
Figure 16D
Figure 17
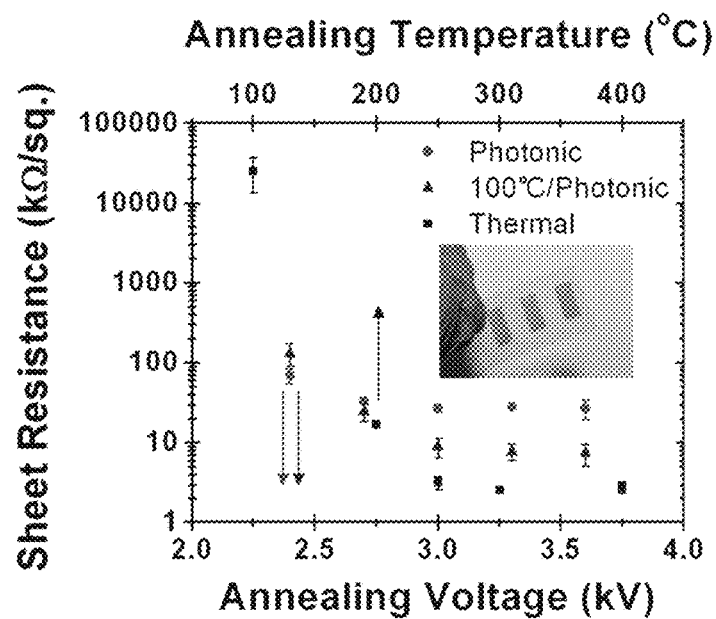

Figure 22A
Figure 22B
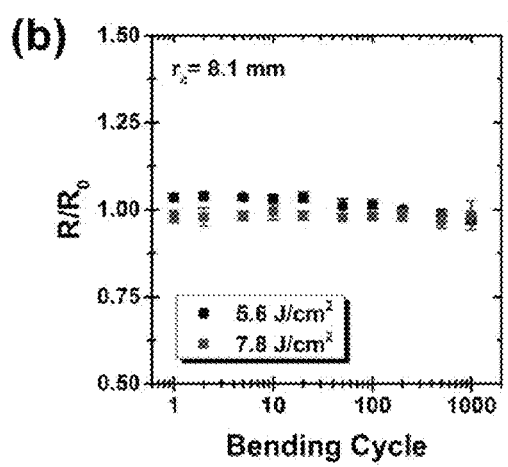
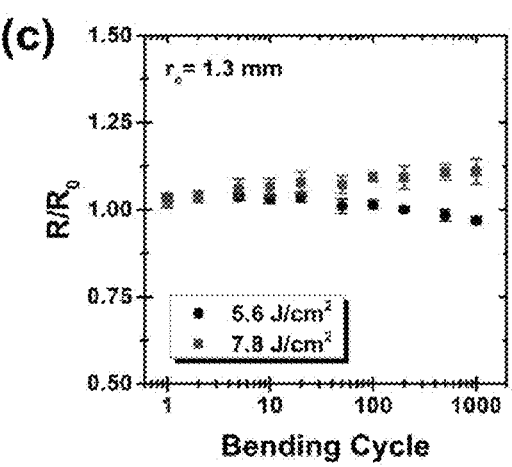

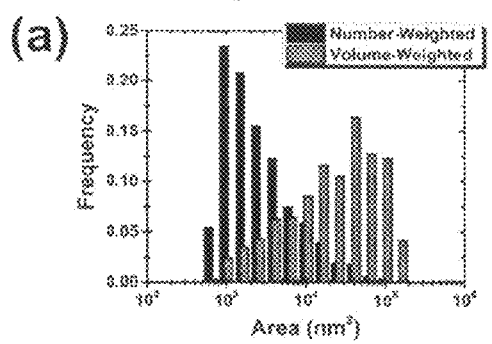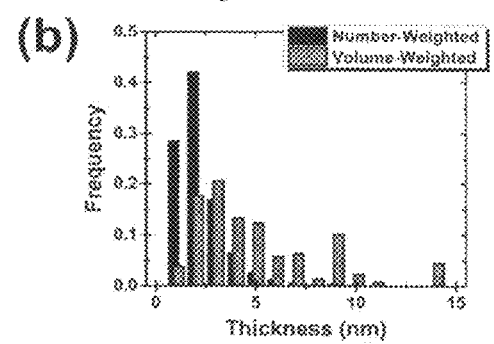
Figure 23A
Figure 23B

Figure 24A
Figure 24B
Figure 24C
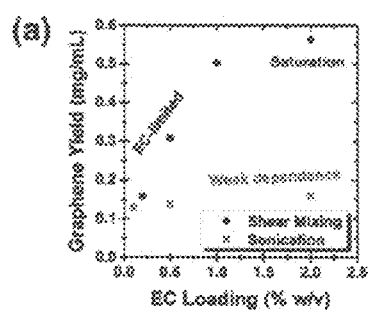 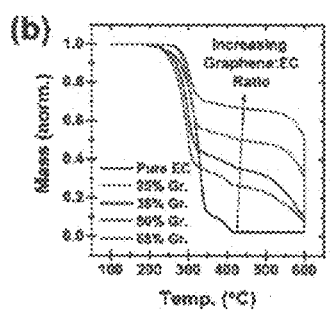 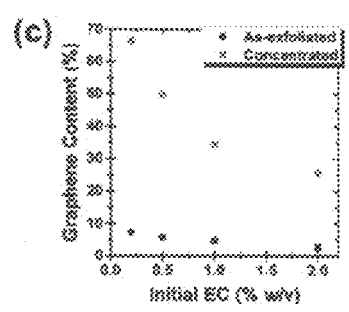

Figure 25A
Figure 25B
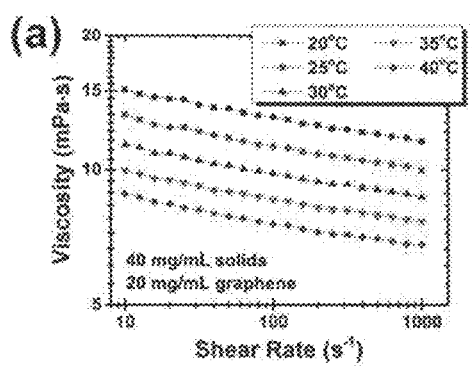
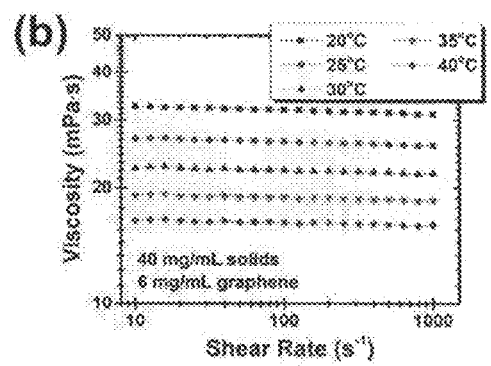

METHODS FOR PREPARATION OF CONCENTRATED GRAPHENE INK COMPOSITIONS AND RELATED COMPOSITE MATERIALS

This application is a continuation-in-part of and claims priority to and the benefit of application Ser. No. 14/121,097 filed Jul. 30, 2014, which claimed priority to and the benefit of application Ser. No. 61/861,257 filed Aug. 1, 2013 and is a continuation-in-part of and claims priority to and the benefit of application Ser. No. 13/453,608 filed Apr. 23, 2012 and issued as U.S. Pat. No. 9,079,764 on Jul. 14, 2015, which claimed priority benefit of application Ser. No. 61/478,361 filed Apr. 22, 2011—each of which is incorporated herein by reference in its entirety.

This invention was made with government support under DE-FG02-03ER15457 awarded by the Department of Energy, N00014-11-1-0690 awarded by the Office of Naval Research and DMR-1121262 awarded by the National Science Foundation. The government has certain rights in the invention.

BACKGROUND OF THE INVENTION

Graphene, a two-dimensional $sp^2$-hybridized lattice of carbon atoms, has generated intense interest due to its unique electronic, mechanical, chemical, and catalytic properties. Recent synthetic efforts have focused on the development of high-yield and scalable methods of generating graphene. These techniques include the direct exfoliation of either chemically modified or pristine graphene directly into various solvents. For example, graphene oxide (GO) can be exfoliated from graphite via acidic treatments. The resulting GO flakes contain hydroxyl, epoxyl, carbonyl, and carboxyl groups along the basal plane and edges that render GO strongly hydrophilic. The ease of dispersing GO in solution has facilitated the preparation of GO thin films and GO-polymer nanocomposites with interesting and potentially useful mechanical properties. However, due to the defects and consequent disruption of the graphene band structure introduced during oxidation, GO is a poor electrical conductor. Although the level of oxygenation can be partially reversed through additional chemical reduction steps, significant quantities of structural and chemical defects remain. Moreover, the electrical conductivity of reduced GO flakes is less than optimal and is certainly deficient by comparison to pristine graphene.

In an effort to circumvent such GO limitations, recent efforts have focused on direct solution-phase exfoliation of pristine graphene. Graphene sheets can be extracted using superacids, by sonication in surfactant solutions and through use of organic solvents. For example, superacids have demonstrated an unprecedented graphene solubility of 2 mg/mL through the protonation and debundling of graphitic sheets. However, the resulting solutions are not ideally suited for additional processing due to their acidity-dependent solubility and high reactivity. Direct exfoliation of graphene in surfactant solutions and select organic solvents has also been demonstrated with concentrations up to 0.3 mg/mL and 1.2 mg/mL, respectively, but such concentrations are achieved only following prolonged sonication times—approaching 3 weeks in duration—or extended ultracentrifugation.

Concurrently, printed electronics offers an attractive alternative to conventional technologies by enabling low cost, large area, flexible devices that have the potential to enable unique advances in varied applications such as health diagnostics, energy storage, electronic displays, and food security. Among available manufacturing techniques, inkjet printing-based fabrication is a promising approach for rapid development and deployment of new material inks. The main advantages of this technology include digital and additive patterning, reduction in material waste, and compatibility with a variety of substrates with different degrees of mechanical flexibility and form-factor. Various technologically important active components have been inkjet-printed including transistors, solar cells, light-emitting diodes, and sensors. Despite these device-level advances, the ability to pattern low-resistance metallic electrodes with fine resolution remains an important challenge, especially as the field evolves towards highly integrated systems.

As discussed above, graphene is a prominent contender as a metallic component in printed electronic devices due to its high conductivity, chemical stability, and intrinsic flexibility. In particular, graphene inks provide an alternative to conventional carbon-based inks that have shown limited conductivity, especially in formulations compatible with inkjet printing. However, such an application requires the production of large-area graphene that can be easily manipulated into complex device architectures. Some of the primary methods that are being explored for the mass production of graphene include growth by chemical vapor deposition (CVD), sublimation of Si from SiC, and solution-phase exfoliation of graphite or reduced graphene oxide (RGO). Among these approaches, solution-phase exfoliation offers significant advantages such as inexpensive raw materials, potential for scalability, low thermal budget, and compatibility with additive printing techniques. Exploiting these attributes, previous studies have demonstrated inkjet printing of RGO for organic thin-film transistor electrodes, temperature sensors, radio frequency applications, and chemical sensors. Nevertheless, since the electrical properties of RGO are inferior to graphene, inkjet printing of pristine graphene flakes is expected to have clear advantages in electronic applications.

Graphene can be directly exfoliated by ultrasonication in select solvents and superacids, or through the use of additives such as planar surfactants and stabilizing polymers, resulting in relatively small (<10 $\mu m^2$ in area) graphene flakes. While small flakes are necessary for stable inkjet printing, they introduce an increased number of flake-to-flake junctions in percolating films, which renders them more resistive compared to CVD grown or mechanically exfoliated graphene. Moreover, traditional solvents and surfactants employed for graphene exfoliation leave persistent residues even following extensive annealing, further disrupting the conductive network.

Processing complexities represent a bottleneck for fundamental studies and end-use applications that require well-dispersed, highly concentrated, pristine graphene solutions. Accordingly, there remains an on-going search in the art for an improved approach to graphene solution concentrations—of the sort suitable for inkjet printing and related applications—sufficient to better realize the benefits and advantages available from graphene and related material compositions.

SUMMARY OF THE INVENTION

In light of the foregoing, it is an object of the present invention to provide methods relating to the preparation of concentrated graphene media, together with corresponding compositions and composites available therefrom, thereby overcoming various deficiencies and shortcomings of the prior art, including those outlined above. It will be understood by those skilled in the art that one or more aspects of this invention can meet certain objectives, while one or more aspects can meet certain other objectives. Each objective may not apply equally, in all its respects, to every aspect of this invention. As such, the following objects can be viewed in the alternative, with respect to any one aspect of this invention.

It can also be an object of the present invention to provide a rapid, scalable methodology for preparation of highly-concentrated graphene media without impractical, time-inefficient, excessively-long sonication and/or centrifugation procedures.

It can be an object of the present invention to provide an economical, efficient approach to the preparation of graphene solutions, dispersions and related graphene ink compositions, using low-cost organic solvents, such compositions at concentrations sufficient, and surface tension and viscosity tunable, for a range of end-use applications.

It can also be an object of the present invention, alone or in conjunction with one or more of the preceding objectives, to provide a low temperature, environmentally benign approach to stable inkjet graphene printing en route to the fabrication of high-conductivity patterns suitable for flexible or foldable electronics.

Other objects, features, benefits and advantages of the present invention will be apparent from the summary and the following descriptions of certain embodiments, and will be readily apparent to those skilled in the art having knowledge of various graphene preparation methods and inkjet printing applications. Such objects, features, benefits and advantages will be apparent from the above as taken into conjunction with the accompanying examples, data, figures and all reasonable inferences to be drawn therefrom.

In part, the present invention can provide a method of using a cellulosic polymer for preparing concentrated graphene media and related compositions. Such a method can comprise exfoliating a graphene source material with a medium comprising an organic solvent at least partially miscible with water and a cellulosic polymer dispersing or stabilizing agent at least partially soluble in such an organic solvent; contacting at least a portion of such an exfoliated graphene medium with a hydrophobic fluid component; and hydrating such a graphene medium to concentrate exfoliated graphene in such a hydrophobic fluid component. Without limitation, such concentration can be achieved without application of centrifugal force.

Alternatively, the present invention can provide a method of using a cellulosic polymer for preparing concentrated graphene media and related compositions. Such a method can comprise providing a graphene source material; exfoliating such a graphene source material with a medium comprising an organic solvent at least partially miscible with water and a dispersing or stabilizing agent comprising a cellulosic polymer, such a dispersing agent at least partially soluble in such an organic solvent; contacting at least a portion of such an exfoliated graphene medium with an aqueous medium to concentrate exfoliated graphene in a composition comprising graphene and such a cellulosic polymer; and contacting such a graphene-cellulosic polymer composition with a hydrophobic fluid component. Without limitation, exfoliating a graphene source material can be achieved through shear mixing such a material with such a medium.

In certain non-limiting embodiments, such an organic solvent can be selected from suitable alcohols, esters, amides, ethers, and ketones and combinations thereof, such a solvent as can partially solubilize such a cellulosic dispersing agent. In certain such embodiments, such a solvent can comprise ethanol or dimethylformamide. Regardless of solvent identity, such a dispersing/stabilizing agent can comprise a cellulose polymer about 46-about 48% ethoxylated.

Without limitation as to identity of an organic solvent and/or a dispersing agent, a hydrophobic fluid component of this invention can be selected from fluid hydrophobic components at least partially miscible with such an organic solvent but immiscible with water. Such hydrophobic components can include, without limitation, chloroform, $\sim C_6 - \sim C_8$ alkanes, terpenes, terpene alcohols and combinations thereof, optionally together with compositions comprising one or more such components and one or more suitable co-dispersants. In certain embodiments, such a hydrophobic fluid component can comprise a terpineol or, alternatively, a terpineol and cyclohexanone. Regardless, such a method can utilize a graphite as a graphene source material.

Without limitation as to organic solvent, dispersing agent and/or hydrophobic fluid component, a method of this invention can comprise iterative separation of a graphene-hydrophobic fluid component from such an organic solvent medium, and subsequent contact with another portion of such an exfoliated graphene medium. Alternatively, a method of this invention can, optionally comprise iterative concentration of a graphene-cellulosic polymer composition and subsequent dispersion. Regardless, a resulting concentrated graphene ink can be deposited or printed on a substrate component, then can be annealed to at least partially remove and/or decompose residual dispersing/stabilizing cellulosic agent.

In part, the present invention can also be directed to a method of concentrating a graphene medium. Such a method can comprise exfoliating graphene from a graphene source material with a medium comprising an organic solvent selected from ethanol and dimethylformamide, and an ethyl cellulose; contacting at least a portion of such an exfoliated graphene medium with a terpineol; adding water to the graphene medium to concentrate exfoliated graphene within such a terpineol component; separating such a graphene-terpineol component from such a hydrated medium; and, optionally, iterative contact of such a separated graphene-terpineol fluid component with additional portions of an exfoliated graphene medium, to concentrate graphene therein. Such concentration can be achieved absent centrifugation. A graphene ink resulting from such iterative concentrations can be applied to a suitable substrate, then annealed to remove dispersing agent.

In part, the present invention can also be directed to a method of preparing a graphene ink composition. Such a method can comprise exfoliating graphene from a graphene source material with a medium comprising an organic solvent selected from ethanol and dimethylformamide, and an ethyl cellulose; contacting at least a portion of such an exfoliated graphene medium with an aqueous (e.g., without limitation, an aqueous NaCl solution) medium to concentrate exfoliated graphene and ethyl cellulose; and contacting such a graphene-cellulose composition with a hydrophobic fluid (e.g., without limitation, comprising a terpineol and cyclohexanone) component. In certain non-limiting embodiments, exfoliating a graphene source material can comprise or can be achieved by shear mixing such a material and such a medium. Regardless, a resulting graphene ink composition can be applied to, deposited and/or printed on a suitable substrate then annealed.

Alternatively, the present invention can be directed to a method of preparing an inkjet printed graphene ink composition. Such a method can comprise exfoliating a graphene source material with a medium comprising an organic solvent selected from ethanol and dimethylformamide, and an ethyl cellulose; optionally contacting at least a portion of such an exfoliated graphene medium with an aqueous medium to concentrate exfoliated graphene and ethyl cellulose in a precursor composition comprising graphene and such a cellulose; contacting such a graphene-cellulose precursor composition with a hydrophobic fluid component, to provide a graphene ink composition; inkjet printing such a graphene ink composition on a substrate; and photonic annealing such a printed graphene ink composition. Such a hydrophobic fluid component can be as described above. Without limitation, a resulting graphene ink composition can have a graphene concentration greater than about 3 mg/mL. In certain such embodiments, such an ink composition can have a graphene concentration up to about 20 mg/mL. Regardless, such an ink composition can have a solids content and viscosity suitable for inkjet printing. Photonic annealing can afford a printed graphene ink composition with conductance and/or sheet resistance comparable to that of thermally annealed compositions.

Accordingly, the present invention can also be directed to a composition comprising graphene, a hydrophobic fluid component and a graphene dispersing/stabilizing agent at least partially soluble in such a hydrophobic fluid component. Without limitation, such a dispersing/stabilizing agent can comprise ethyl cellulose. In various embodiments, regardless of dispersing/stabilizing agent, such a hydrophobic fluid component can comprise a component selected from terpenes, terpene alcohols and related compositions. In certain such embodiments, such a hydrophobic fluid component can comprise a mixture of terpineol and cyclohexanone. Thermal annealing can provide such a composition comprising a decomposition product of ethyl cellulose.

Regardless, an ink composition of this invention can comprise a graphene concentration of up to or greater than about 3 mg/ml . . . about 10 mg/mL . . . or about 20 mg/mL or more. As discussed herein, such a composition can have a solids content and viscosity suitable for inkjet printing. In certain embodiments, such an ink composition can have a solids content up to about 4% w/v or more and a viscosity of about 5-about 20 mPa·sec. Without limitation as to any particular graphene concentration, such a composition can comprise small, unagglomerated graphene flakes, such a morphology as can be evidenced by atomic force microscopy. Regardless, in certain embodiments, such a composition can be inkjet printed or patterned on a substrate and annealed, providing such a printed composition a conductivity of greater than about $2 \times 10^4$ S/m.

The present invention can, in part, be directed to a composite comprising such a graphene ink composition coupled to a flexible or foldable polymeric substrate component, such a graphene composition as can be inkjet printed on such a substrate and incorporated into an electronic device structure. Such a composition can be considered as comprising a thermal or photonic annealation/decomposition product of ethyl cellulose-stabilized graphene, having a solids content, graphene concentration and/or viscosity as discussed herein. Regardless, with respect to such an ink composition, print morphology, electrical performance and mechanical properties can be substantially maintained over repeated substrate bending or folding.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 1A-B. (A) Digital images of vials of a 1:5 mixture of terpineol and ethyl cellulose stabilized graphene-ethanol solution before and after water addition. As shown by the images, upon the addition of water, the hydrophobic graphene flakes preferentially separate into the concentrated terpineol fraction, leaving behind an ethanol and water mixture. (B) The concentration factor of graphene ($C_0$=102.4 μg/mL) is plotted after each solvent exchange concentration and graphene-ethanol addition step for three iterations.

FIGS. 2A-D. (A) Histograms of flake thickness for the initially exfoliated and third-iteration concentrated graphene solutions. (B) Digital scanning electron micrograph (SEM) images of a graphene-ethyl cellulose nanocomposite fracture surface. (C) Optical transmittance versus sheet resistance for annealed transparent conductive thin films blade coated from the concentrated graphene inks. (D) Digital SEM image of an annealed graphene thin film.

FIGS. 10A-B. TGA of pure EC (black) and graphene/EC composite powder (red), showing (A) mass as a function of temperature and (B) the differential mass loss. For the composite powder, the decomposition peaks of EC in (B) are shifted to different temperatures due to the presence of graphene.

FIGS. 16A-D. Shear mixing of graphene. (A) Graphene concentration for shear mixing as a function of time and centrifuge rate, highlighting data points for sonication and shear mixing batch processes. (B) Representative digital AFM image of graphene flakes produced by shear mixing. (C) Flake thickness and (D) flake area distributions for graphene produced by shear mixing.

FIG. 17. Photonic annealing of graphene patterns. Sheet resistance of graphene patterns with different post-processing conditions, including thermal annealing, photonic annealing, and combined thermal and photonic annealing. (inset) Digital optical image of conductive graphene patterns on polyethylene terephthalate (PET) following combined thermal and photonic annealing.

FIGS. 22A-B. Resistance measured over cyclic bending cycles of graphene lines on PEN following IPL annealing at 5.6 and 7.8 $J/cm^2$, with bending radii of curvature of 8.1 (A) and 1.3 mm (B), respectively.

FIGS. 23A-B. Characterization of solvent-exfoliated graphene comprising the inks. (A) Flake area distribution for the graphene sample, indicating both number-weighted and volume-weighted distributions. (B) Flake thickness distribution showing both number-weighted and volume-weighted histograms.

FIGS. 24A-C. (A) Graphene yield as a function of ethyl cellulose loading for sonication and shear mixing based exfoliation. (B) TGA curves of graphene/EC powders prepared with different initial EC concentrations, illustrating the ability to broadly tune the final graphene/EC ratio. (C) Graphene content as a percentage by weight of total solids for different batches, both prior to and following the flocculation step.

FIGS. 25A-B. Rheological properties of graphene inks. (A) Viscosity as a function of shear rate for high graphene content inks at temperatures relevant for inkjet printing. (B) Corresponding viscosity vs. shear rate plots for an ink with the same solids content, but lower graphene:EC ratio, showing a viscosity too high for optimal inkjet printing.

DETAILED DESCRIPTION OF CERTAIN EMBODIMENTS

Figure 1C:
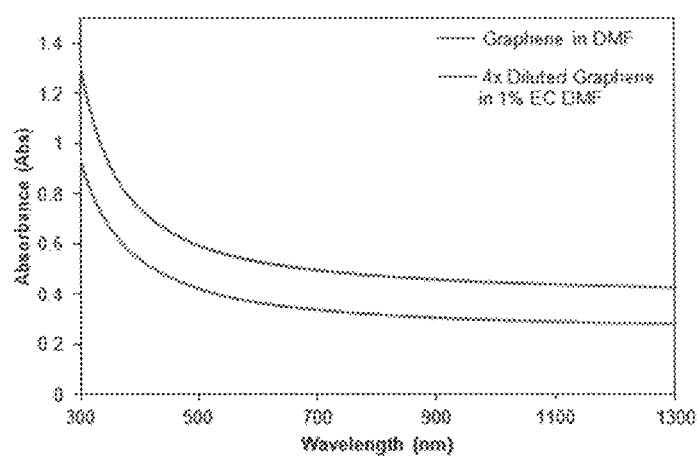
FIG. 1C. UV-vis absorbance spectra for graphene dispersed in DMF (upper plot) and 1% w/v EC-DMF (lower plot). Due to the high graphene concentration of the EC-DMF dispersion, the sample was diluted 4× in DMF to obtain a clear absorbance spectra.

Without limitation, various embodiments of this invention demonstrate an alternative strategy for enhancing graphene exfoliation using a polymer-organic solvent composition. More specifically, as relates to certain such embodiments, a room-temperature, ultracentrifuge-free concentration technique can be used to generate graphene concentrations in excess of 1 mg/mL in organic solvents that otherwise yield poor graphene dispersability. The resulting graphene inks are amenable to further processing, including casting into aligned graphene-polymer nanocomposites and blade coating to form thin films, as a result of their low solvent boiling point and non-causticity. Because the present invention avoids oxidative conditions, the graphene maintains superlative electronic properties, which can be exploited in applications that require highly conductive, mechanically flexible, and solution-processable coatings.

Due to the large mismatch between the surface energies of ethanol and graphite, ethanol is a relatively poor solvent for graphene exfoliation, yielding a post-sedimentation concentration of 1.6 μg/mL. (See, Hernandez, Y.; Lotya, M.; Rickard, D.; Bergin, S. D.; Coleman, J. N.; *Langmuir* 2010, 26, 3208-3213.) To overcome this limitation, a cellulosic polymer was used to enhance the ability of ethanol to exfoliate and suspend graphene flakes. Such polymers include, but are not limited to ethyl cellulose, methyl cellulose, hydroxyethyl cellulose, carboxymethyl cellulose, and hydroxypropylmethyl cellulose. Using ethyl cellulose (EC), a solution of 50 mg/mL natural graphite flakes in 1% w/v EC-ethanol was sonicated for 3 hr and centrifuged at 7,500 rpm for 4.5 hr to remove the fast sedimenting graphite flakes. The resulting supernatant provides primarily few-layer graphene sheets. Optical absorbance was taken to determine the graphene concentration using an absorption coefficient of 2,460 L/g·m at 660 nm. Without limitation as to any one theory or mode of operation, addition of up to about 1% or more EC significantly enhanced the graphene exfoliation efficiency by providing steric stabilization of the exfoliated flakes, yielding a post-sedimentation concentration of 122.2 μg/mL. Despite this improvement, still higher concentrations were desired to generate graphene inks that can be easily deposited and patterned.

Towards this end, an iterative solvent exchange was employed as a rapid room-temperature process to concentrate graphene solutions—without the application of centrifugal force. Various hydrophobic fluid solvent components at least partially miscible with an organic solvent such an ethanol (or e.g., dimethylformamide or methylpyrrolidone), but not miscible with an aqueous solvent component (e.g., ethanol and water) can be utilized. In particular, a 1:5 volume ratio solution of terpineol and sedimented graphene solution was prepared and mixed to yield a solution with an initial graphene concentration of $C_0$=102.4 μg/mL. Water, four times the volume of this initial solution, was then added to form a hydrophilic ethanol solution. Again, without limitation to theory or mode of operation, because of the hydrophobicity of the EC-stabilized flakes, graphene is believed preferentially concentrated into the terpineol band on top of the ethanol-water solution (FIG. 1A). This terpineol phase was then harvested and additional sedimented graphene solution was added for the next concentration iteration. Concentration factors, $C/C_0$, were determined after each step through optical absorbance for three concentration iterations (FIG. 1B). As expected, the concentration factors correspond roughly to the volumetric reduction of the graphene solution, producing a highly concentrated graphene ink at 1.02 mg/mL after three iterations. Additional iterations of solvent exchange yielded diminishing returns as the viscosity of the graphene ink begin to interfere with material separation within the system. In order to verify the absence of flake agglomeration during the concentration process, atomic force microscopy was performed on over 140 flakes deposited from the sedimented graphene solution and the third iteration graphene ink. Both media exhibited similar flake thickness histograms peaked at approximately 1.6-1.8 nm (FIG. 2A), suggesting minimal graphene agglomeration during the concentration process.

Graphene-polymer nanocomposites were solution cast from these graphene inks. The height reduction associated with anisotropic volume contraction during solvent evaporation resulted in the directional alignment of the graphene flakes within the nanocomposite. In FIG. 2B, this alignment is evident on the fracture surface in the form of sheared terraces orthogonal to the direction of the volumetric contraction. The lack of protruding graphene flakes on the fracture surface is not only indicative of flake alignment but also suggests strong interactions between the polymer and graphene.

The electrical properties of thin films derived from the concentrated graphene ink were assessed via transparent conductor measurements. Due to their enhanced rheology, film forming capability, and dispersion stability, EC-stabilized graphene inks are amenable to blade coating onto a broad range of substrates. For example, graphene inks were blade coated onto glass slides at varying thicknesses, annealed at 400° C. for 30 min in air, and rinsed with acetone to produce transparent conductive thin films. Four point probe measurements of the film sheet resistance indicate that their electrical performance compare favorably to films deposited by vacuum filtration from sedimented surfactant graphene solutions (FIG. 2C). Electron microscopy performed on these conductive graphene thin films (FIG. 2D) reveals a disordered network of graphene flakes with lateral dimensions ranging from approximately 50-400 nm. Raman spectra provide further evidence that these graphene thin films possess low defect densities and negligible oxidation.

As demonstrated, efficient graphene exfoliation can be achieved in ethanol through polymeric stabilization using ethyl cellulose. The resulting graphene solutions can be concentrated via rapid, room-temperature, ultracentrifugation-free iterative solvent exchange, ultimately yielding stable graphene inks at mg/mL levels. The outstanding processability and electrical properties of the resulting inks enable the straightforward production of functional graphene-based materials including highly anisotropic polymer nanocomposites and transparent conductive thin films. Such results can promote ongoing efforts to understand and exploit solution-processable pristine graphene for fundamental studies and device applications.

Figure 8A:
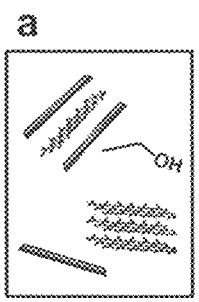
FIGS. 8A-F. Schematic illustration of the ink preparation method. (A) Graphene is exfoliated from graphite powder in ethanol/EC by probe ultrasonication. A graphene/EC powder is then isolated following (B) centrifugation-based sedimentation to remove residual large graphite flakes and (C) salt-induced flocculation of graphene/EC. (D) An ink for inkjet printing is prepared by dispersion of the graphene/EC powder in 85:15 cyclohexanone:terpineol. Digital images of (E) vial of the prepared graphene ink and (F) drop formation sequence for inkjet printing, with spherical drops forming after ~300 μm.
Figure 8B:
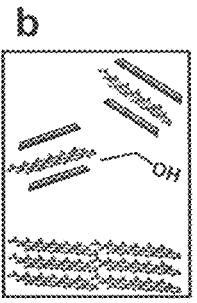
Figure 8C:
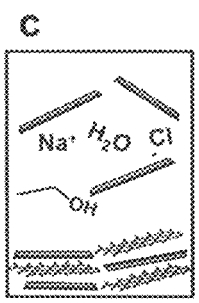
Figure 8D:
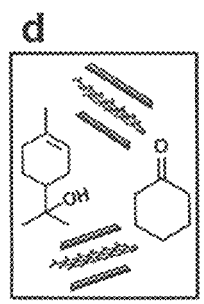
Figure 8E:
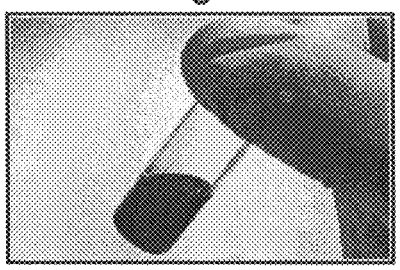
Figure 8F:
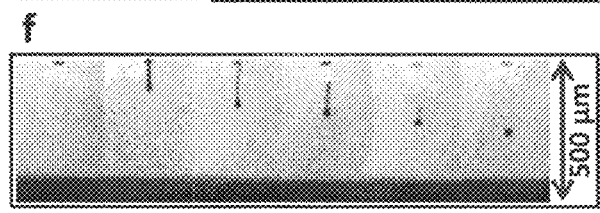
Figure 9A:
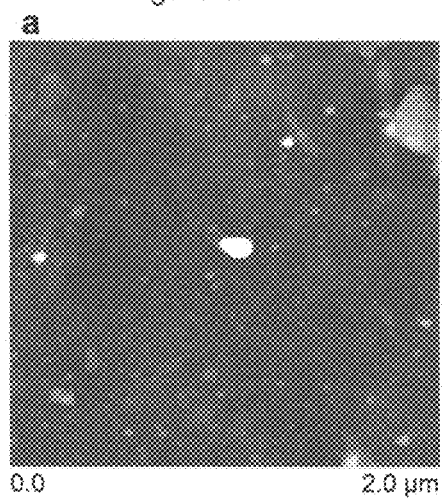
FIGS. 9A-C. Characterization of graphene flakes. (A) A representative digital AFM scan of the graphene flakes that was used to obtain particle statistics. Histograms of (B) flake thickness and (C) flake area for 355 and 216 flakes, respectively.
Figure 9B:
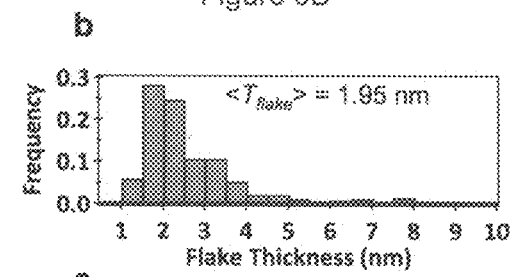
Figure 9C:
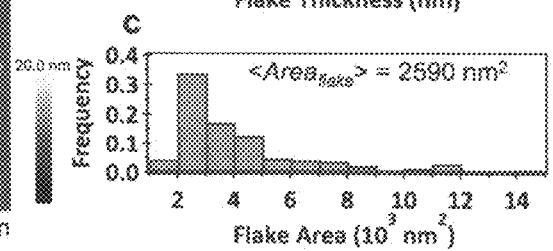

Relating to certain such embodiments of this invention, graphene inks were produced by the exfoliation of graphite in ethanol and ethyl cellulose (EC), as described more fully below. Generally, such a process primarily produces few-layer graphene sheets, with typical thicknesses of ~2 nm and areas of ~50×50 nm$^2$ (FIG. 9). Processing steps are illustrated schematically in FIG. 8. In particular, excess graphite and EC were used to achieve high yields of suspended graphene (>0.1 mg/mL). Sedimentation-based centrifugation was then employed (FIG. 8A-B) to remove remaining large graphite flakes, yielding a dispersion of ~1:100 graphene/EC in ethanol. To remove excess EC and solvent, a room-temperature method based on the flocculation of graphene/EC was developed. Specifically, upon the addition of NaCl (aq), a solid containing graphene and EC was flocculated and collected following a short centrifugation step (FIG. 8C). This graphene/EC solid was subsequently washed with water and dried, yielding a black powder with a graphene content of ~15% (FIG. 10), which is significantly higher than the graphene/EC ratio in the original dispersion. Because EC encapsulates graphene flakes in solution, no irreversible aggregation of graphene was observed. The resulting powder is readily dispersed in a variety of solvents, allowing for the tailoring of inks for a range of deposition methods. In particular, dispersion of this material in select organic solvents (FIG. 1D-E) enables deposition of graphene by inkjet printing (FIG. 8F).

Figure 11:
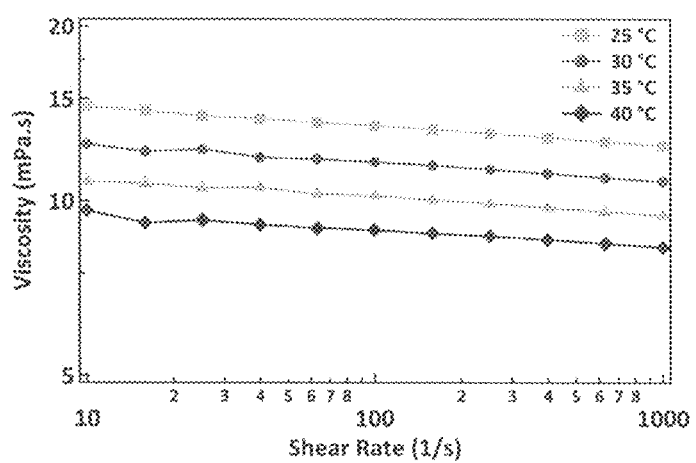
FIG. 11. Shear viscosity of the graphene ink over a shear rate range of 10-1000 $s^{-1}$ at temperatures of 25, 30, 35 and 40° C.

Inkjet printing requires careful tailoring of the viscosity and surface tension of the ink formulation to achieve stable droplet formation. The wetting and drying properties of the ink must also be tuned to achieve proper morphology of the printed features. Furthermore, inks should not possess large particles or volatile solvents since these components can lead to clogging of the inkjet printhead. Finally, a high concentration of graphene is desired to reduce the number of necessary printing passes. To achieve these goals, the graphene/EC powder was dispersed in a 85:15 mixture of cyclohexanone:terpineol (FIG. 8D). At a concentration of 2.4 wt % graphene/EC composite (~3.4 mg/mL graphene), this ink has a surface tension of ~33 mN/m and a high shear rate (100-1000 s$^{-1}$) viscosity of 10-12 mPa·s at 30° C. (FIG. 11).

Figure 12A:
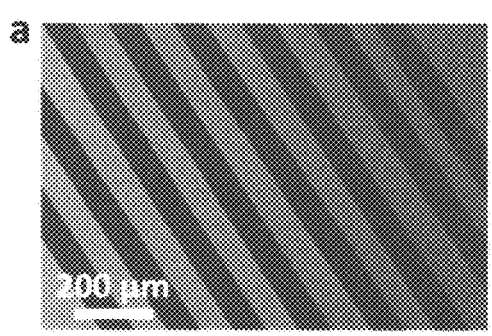
FIG. 12A-D. Morphology of inkjet-printed graphene features on HMDS-treated $Si/SiO_2$. Digital scanning electron micrographs of (A) multiple printed lines and (B) a single printed line and drop (inset, scale bar corresponds to 40 µm) illustrate the uniformity of the printed features. (C) A digital atomic force microscopy (AFM) image of a single line following 10 printing passes that shows no coffee ring features. (D) Averaged cross-sectional profiles of printed lines after 1, 3, and 10 printing passes, which demonstrate the reliable increase in thickness obtained after multiple printing passes. The cross-sectional profiles are obtained from the averaged AFM height profile over ~20 µm as indicated by the boxed region in (C).
Figure 12B:
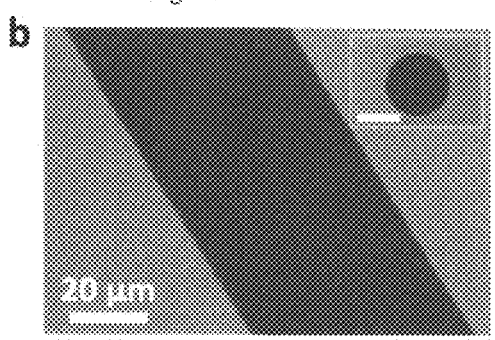
Figure 12C:
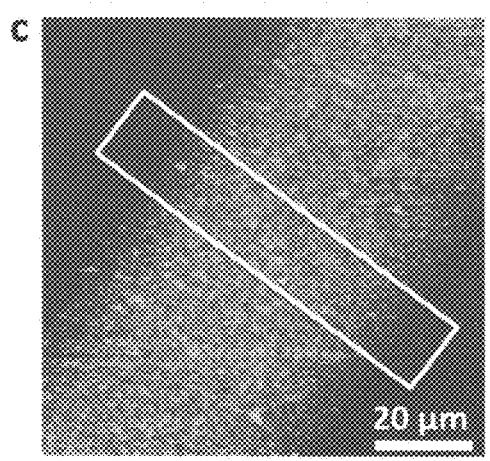
Figure 12D:
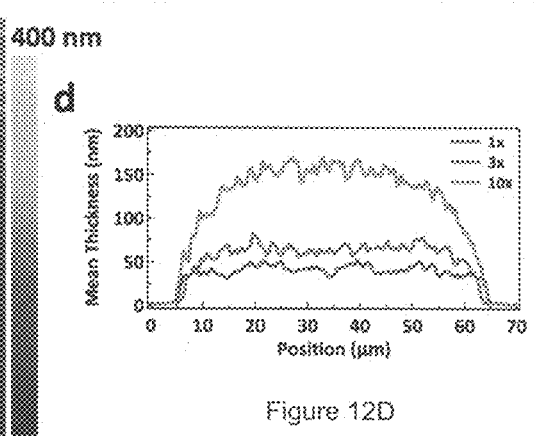

The relatively low surface tension of this ink is designed for proper wetting of low surface energy substrates applicable to flexible electronics. To assess the electrical characteristics of the ink, a well-defined substrate of Si/SiO$_2$ with 300 nm thermally grown oxide was used. For a more suitable model of wetting and drying on low surface energy substrates, the Si/SiO$_2$ substrate was treated with hexamethyldisilazane (HMDS) to decrease the surface energy. Printing was carried out at 30° C. using a Fujifilm Dimatix Materials Printer (DMP 2800) with a cartridge designed for a 10 pL nominal drop volume. Drop spacing for all printed features was maintained at 20 μm. Stable printing of graphene lines on HMDS-treated Si/SiO$_2$ yielded a line width of ~60 μm, as shown in FIG. 12A-C. The highly uniform dome-shaped cross-sectional profile across the lines provides evidence for successful ink formulation, specifically showing no undesirable coffee ring effects. Importantly, this advantageous cross-sectional profile was maintained after multiple printing passes, as shown in FIG. 12D. This excellent morphology of the printed features is, without limitation, believed attributable to the suppression of the coffee ring effect through a Marangoni flow established by the surface tension gradient that develops due to solvent evaporation. This flow homogenizes the droplet composition, resulting in a uniform morphology of the printed features. Again, without limitation to any one theory or mode of operation, the sp$^2$-bonding and small lateral size of the graphene flakes minimizes folding or buckling of the printed flakes, which promotes low surface roughness and well-defined flake-flake contacts.

Figure 13A:
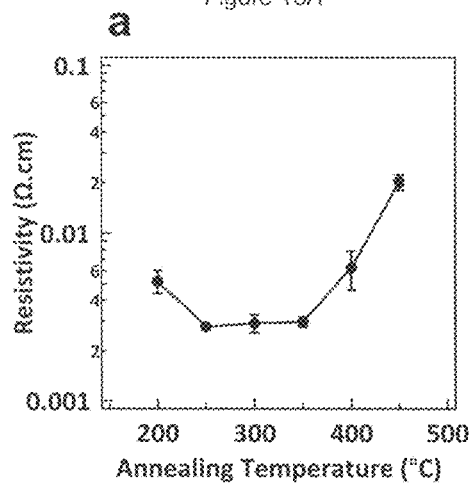
FIGS. 13A-D. Electrical characterization of graphene features. (A) Electrical resistivity of blade-coated films plotted against annealing temperature for a fixed annealing time of 30 minutes, showing effective binder decomposition at 250° C. and increased resistivity due to graphene oxidation above 400° C. (B) Dependence of electrical resistivity on annealing time for a fixed annealing temperature of 250° C., showing that low resistivity is achieved following annealing for 20 minutes. (C) Thickness of inkjet-printed graphene lines on HMDS-treated $Si/SiO_2$ for increasing numbers of printing passes. (D) Electrical resistivity of the printed features for increasing numbers of printing passes, showing relatively stable performance after only 3 printing passes.
Figure 13B:
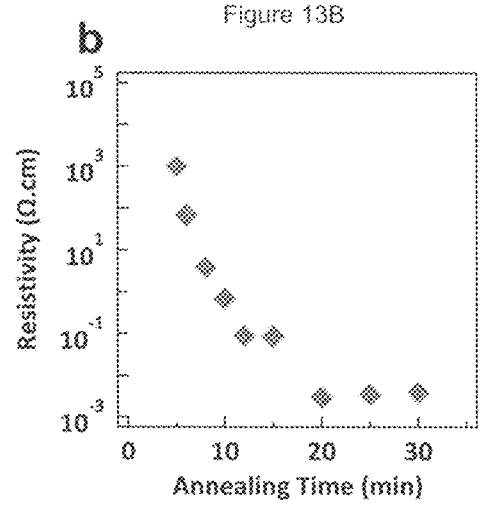

The polymeric binder EC encapsulates graphene flakes following solvent evaporation, and subsequent thermal annealing can be employed to obtain highly conductive features. To study the electrical behavior of the composite material as a function of annealing conditions, films were blade-coated on glass slides and annealed in an ambient atmosphere with systematic variations in the annealing time and temperature. As shown in FIG. 13A, a 250-350° C. anneal for 30 minutes results in high conductivity graphene films. At 250° C., annealing for as short as 20 minutes was sufficient to achieve low resistivity (FIG. 13B). For the remainder of this study, the annealing temperature and time of 250° C. and 30 minutes, respectively, were chosen to enable compatibility with flexible electronics applications.

Figure 13C:
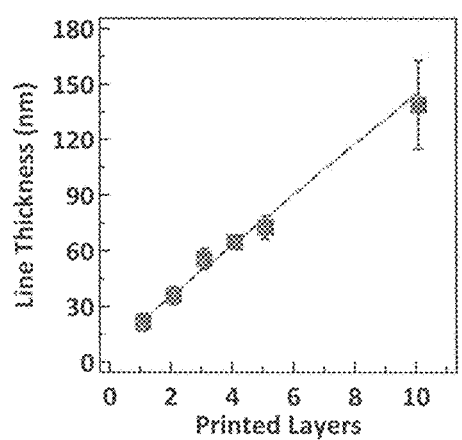
Figure 13D:
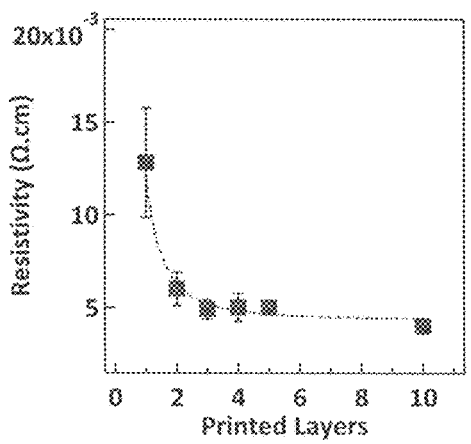
Figure 14A:
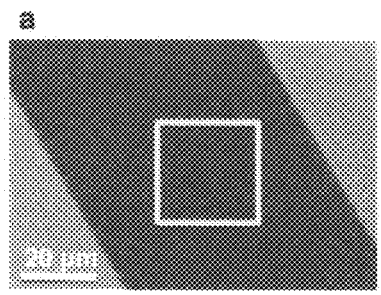
FIGS. 14A-D. Digital SEM images of printed lines annealed to (A, C) 250° C. and (B, D) 450° C. (C) and (D) are higher magnification SEM images of the highlighted area (yellow box) from images (A) and (B), respectively. Following 450° C. annealing, the EC residue is removed, leading to a sparse graphene network. This observation suggests the importance of EC decomposition products in maintaining electrical and mechanical integrity of the printed features.
Figure 14C:
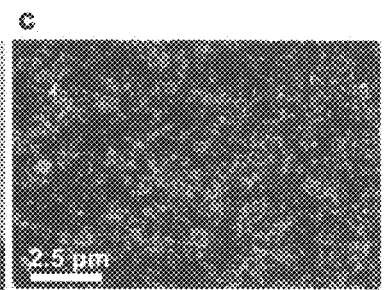
Figure 14B:
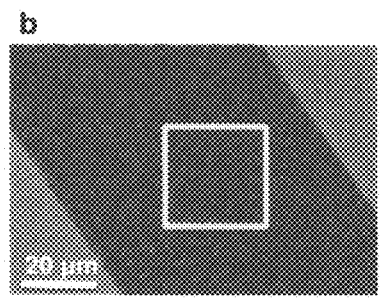
Figure 14D:
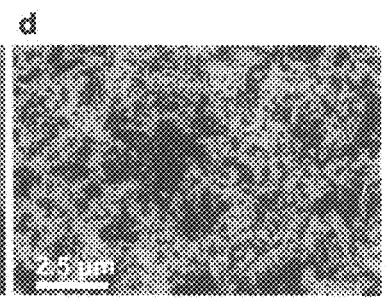

For a detailed assessment of the electrical performance of the printed features, 4 mm long lines with varying thicknesses were printed on HMDS-treated SiO$_2$ and annealed at 250° C. for 30 minutes. The line thickness increases linearly with the number of printed layers, with each layer adding ~14 nm to the thickness (FIG. 13D). The line resistivity reaches a relatively stable low value after only 3 printing passes, owing to the high concentration of the ink and the excellent morphology of the printed features (FIG. 13C). The measured conductivity of 2.5×10$^4$±0.2×10$^4$ S/m (resistivity of 4×10$^{-3}$±0.4×10$^{-3}$ Ω·cm) for the printed lines after 10 printing passes is ~250 times higher than previously reported for inkjet-printed graphene. This dramatic improvement indicates the effectiveness of the method presented here, which avoids the graphene degradation that occurs in competing processes based on ultrasonication of graphene in harsh solvents.

Thermal gravimetric analysis (TGA) of the ink indicates that EC decomposition occurs in two stages, with a low temperature charring beginning below 250° C. and volatilization and removal of the EC residue occurring at temperatures above 400° C. (FIG. 10). This observation coupled with the high electrical conductivity observed after annealing at temperatures of 250-350° C. suggests that the initial decomposition of EC enables efficient charge transport through the graphene network. Because cellulose derivatives can thermally decompose into aromatic species, any resulting pi-pi stacking between the residues and the graphene flakes provides relatively efficient charge transport. In addition, the increase in resistivity upon annealing at 400-450° C. correlates well with the removal of residue from the film in the second stage of EC decomposition. Furthermore, the EC residue creates a dense and continuous film, as determined from scanning electron micrographs of printed lines following annealing at 250° C. and 450° C. (FIG. 14). This film densification could potentially enhance the mechanical properties of the printed graphene features and enable a robust tolerance for bending stresses in flexible applications.

Figure 15A:
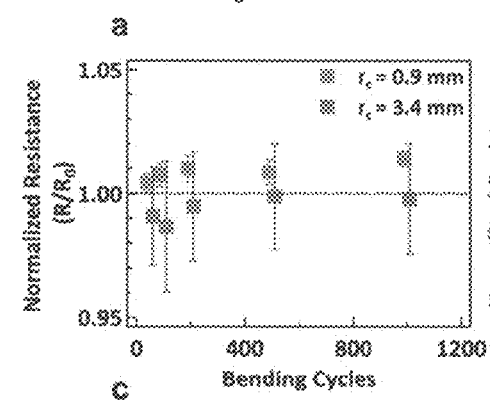
FIGS. 15A-E. Flexibility assessment of printed graphene lines on Kapton® substrates. (A) Resistance of graphene lines folded to a radius of curvature of 0.9 mm (blue, bending strain: 6.9%) and 3.4 mm (red, bending strain: 1.8%) normalized to the resistance prior to bending. (B) Normalized resistance of graphene lines measured in a flexed state for various degrees of bending, showing reliable retention of electrical conductivity across all measured flex states. (C) Normalized resistance of graphene lines while measured in a folded state, showing a small and irreversible increase in resistance following folding. Digital images of the sample in the (D) original and (E) folded state.
Figure 15B:
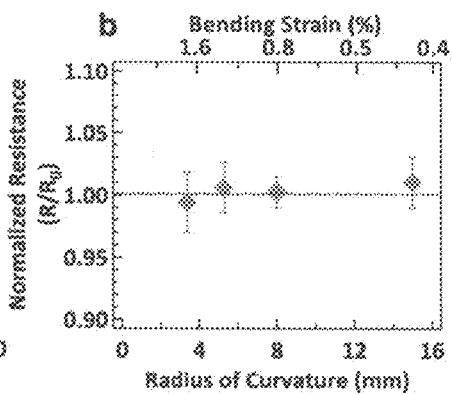
Figure 15C:
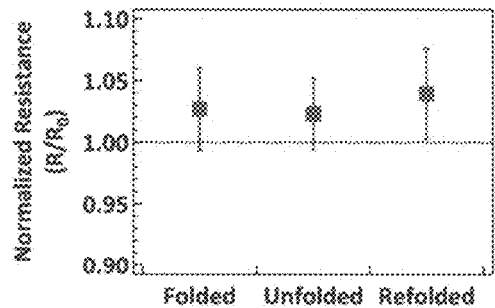
Figure 15D:
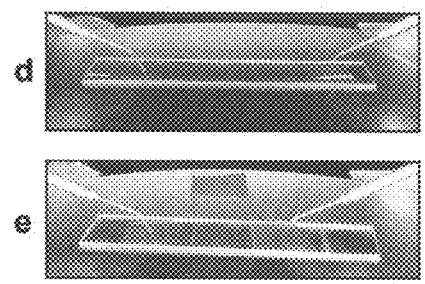
Figure 15E:
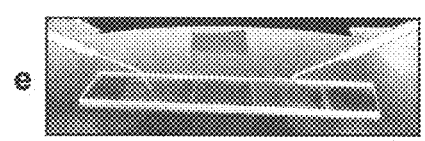

To assess mechanical properties, lines were printed on polyimide (DuPont Kapton® 125 µm) substrates and annealed at 250° C. for 30 minutes. (Such a polyimide is representative of a range of flexible polymeric materials of the sort well-known to those skilled in the art and available for use as a bendable/foldable substrate.) Various flexibility tests were employed to characterize these printed graphene lines. For example, to investigate the reliability over a large number of bending cycles, the electrical resistance was measured up to 1000 cycles. As shown in FIG. 15A, there is no observable degradation in the line conductivity for a bending radius of curvature of 3.4 mm. Even at a radius of 0.9 mm, the resistance remained nearly unchanged after a marginal initial increase. At this radius of curvature, some cracking was observed in the substrate, which suggests that the small loss of conductivity is a limitation of the substrate rather than the printed features. The electrical performance of the printed features was also measured under applied stress for various radii of bending (FIG. 15B), with no observed loss in conductivity. As a final test, the resistance of the graphene lines was measured in a folded state, as shown in FIG. 15C-E, again resulting in only a slight decrease in conductivity on the order of 5% that can again be likely attributed to substrate cracking. Overall, these mechanical tests show the utility of the present graphene inks in flexible, and possibly even foldable, electronic applications.

As relates to certain such embodiments, inkjet printing and a photonic annealing technique can be used to achieve rapid fabrication of high conductivity graphene patterns on a wide range of substrates. More specifically, the graphene and ink production processes can be modified for use of rapid intense pulsed light (IPL) annealing.

Figure 18A:
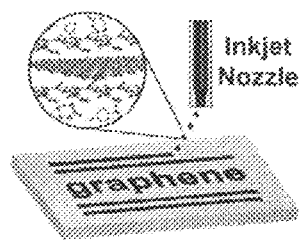
FIGS. 18A-B. Inkjet printing and intense pulsed light (IPL) annealing of graphene. (A) Schematic illustration of inkjet printing of graphene. (B) Schematic illustration of IPL annealing applied to graphene patterns.
Figure 18B:
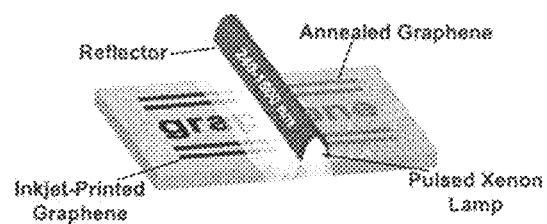

As discussed above, graphene can be produced in gram-scale quantities by liquid phase exfoliation based on shear mixing in the presence of a polymer stabilizer, ethyl cellulose. The resulting graphene flakes can have a typical thickness of ~2 nm and lateral area of ~100 nm×100 nm. Flocculation of the graphene particles produces a graphene/ethyl cellulose composite powder, from which concentrated graphene inks are prepared for inkjet printing, as illustrated in FIG. 18A. The polymer stabilizer enhances the ink stability and printing performance, but decomposition after printing can optimize electrical properties. As discussed above, while polymer decomposition has traditionally been achieved by thermal annealing, the high temperature and long duration required are incompatible with rapid processing and thermally-sensitive substrates, such as polyethylene terephthalate (PET) and polyethylene naphthalate (PEN), which are desirable for printed electronics. To address this issue, IPL annealing, a photonic technique commonly used to sinter metal nanoparticle inks, can be used to afford several advantages, including rapid processing compatible with roll-to-roll manufacturing. As illustrated in FIG. 18B, this method uses a high-intensity pulsed xenon lamp to selectively heat the printed graphene patterns, yielding conductive features with minimal damage to the underlying substrate. Through comprehensive optimization of the graphene production, ink formulation, and annealing conditions, effective IPL annealing of inkjet-printed graphene patterns is demonstrated, achieving significant and simultaneous advances in graphene ink loading, high-speed processing, and substrate versatility.

Figure 19A:
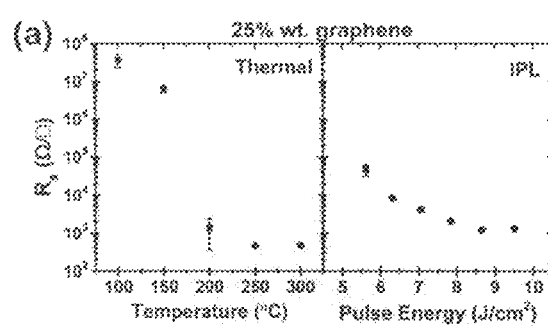
FIGS. 19A-B. Dependence of annealing on graphene: polymer ratio of the films. (A) Sheet resistance as a function of processing conditions for a film containing 25% wt. graphene for thermal (left) and IPL (right) annealing. (B) Corresponding sheet resistance as a function of annealing conditions for a film containing 50% wt. graphene, showing improved effectiveness of IPL annealing.
Figure 19B:
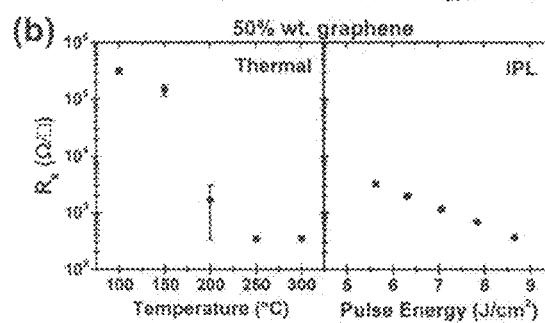

To investigate IPL annealing of inkjet-printed graphene patterns, the printed graphene film composition is investigated. In particular, the graphene:polymer ratio of the printed film can influence the effectiveness of IPL annealing, because photonic annealing can be sensitive to the presence of additives in the ink formulation. By changing the ethyl cellulose composition in the graphene exfoliation step, graphene/ethyl cellulose powders with a graphene composition ranging from about 25 to about 65% wt., as precursors for the graphene inks, and corresponding printed graphene films are obtained. These inks are prepared by dispersion of the graphene/ethyl cellulose powder in a solvent system composed of 85:15 v/v cyclohexanone/terpineol, used previously for high performance inkjet printing. To confirm the relation of the graphene composition and effective IPL annealing, films containing 25 and 50% wt. graphene are printed onto glass slides and PET foils for thermal and IPL annealing, respectively. For the films containing about 25% wt. graphene, the sheet resistance is shown for thermal and IPL annealing in FIG. 19A. Although photonic annealing is able to produce conductive films using pulse energies of 5-10 J/cm$^2$, the conductance of these films is a factor of ~2.5 lower than that of optimized thermally annealed films of the same composition. Corresponding data for films containing about 50% wt. graphene is shown in FIG. 19B. In this case, IPL annealing produces films with a sheet resistance within 10% of the optimized thermally annealed samples. This low sheet resistance of IPL-annealed films containing about 50% wt. graphene demonstrates that IPL annealing is an effective post-processing strategy for this material system, even on temperature-sensitive substrates such as PET. In addition, comparison of the 25 and 50% wt. graphene films confirms that the effectiveness of IPL annealing relates to the graphene:polymer ratio of the printed films. Both thermal and IPL annealing result in similar evolution of the Raman spectra, namely a reduction in the D to G band intensity ratio, $I(D)/I(G)$, for higher energy annealing. (See examples, below).

Figure 20A:
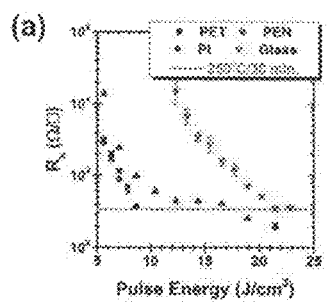
FIGS. 20A-C. Versatility of IPL annealing for graphene patterns. (A) Sheet resistance of graphene films as a function of annealing voltage, for different substrates (PET, PEN, PI, and glass). (B) Optical microscopy images of lines on five different surfaces with a drop spacing of 35 µm, showing high-fidelity, uniform pattern definition. (C) Resolution of inkjet-printed lines on the five surfaces as a function of drop spacing.
Figure 20B:
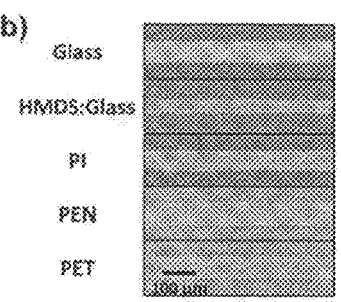
Figure 20C:
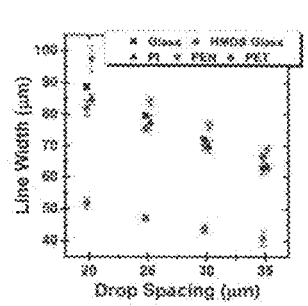

The realization of IPL annealing for graphene films on PET suggests that this method can be generalized to other substrates. The sheet resistance as a function of light pulse energy is shown in FIG. 20A for films on four different substrates, including PET, PEN, polyimide (PI), and glass, confirming the versatility of this method. It is observed that the required pulse energy depends on the particular substrate due primarily to differences in substrate thermal properties. While the low thermal conductivity and limited heat capacity of PET and PEN lead to highly conductive films for low energy light pulses, the somewhat thicker PI, and much thicker glass require additional energy for comparable results. Notably, though, all substrates support graphene films with sheet resistance comparable to that achieved through thermal annealing. To further validate the versatility of this strategy, individual lines were printed on PET, PEN, PI, glass, and hexamethyldisilazane (HMDS)-treated glass to verify the well-behaved wetting and drying properties of the ink on each substrate. As shown in FIG. 20B, we observe highly uniform lines, with well-defined edges and negligible evidence of coffee ring formation, which is attributed to the ink composition, as discussed above. FIG. 20C shows the line resolution on each substrate as a function of the droplet spacing. As expected, the line width decreases with increasing drop spacing, and behaves similarly on untreated substrates. When the substrate surface energy is tuned, as in the case of HMDS-treated glass, high-resolution lines can be obtained, with a line width below 50 µm. Overall, these results verify the suitability of our high-loading graphene ink for a range of substrates, both in terms of inkjet printing performance and compatible annealing.

While the enhanced graphene content of the ink is useful for optimal IPL annealing, it provides an additional benefit with respect to ink formulation. Specifically, graphene and other nanomaterial inks are typically characterized by a relatively low concentration of active material. This low nanomaterial content is a significant impediment for many practical applications, since the number of printing passes required to achieve a desired conductance, or thickness, scales inversely with the solids loading. In most cases, low concentrations are required to mitigate particle aggregation and achieve stable jetting. By contrast, as discussed above, ethyl cellulose acts as a highly effective stabilizer, allowing previously reported graphene concentrations as high as ~3.4 mg/mL for inkjet printing. As such, it appears that the graphene loading for inkjet printing is not limited by particle stability, but is perhaps affected by ink viscosity, which is typically in the range of about 5-about 20 mPa·sec, or, for some non-limiting embodiments about 8-about 15 mPa·s, for inkjet printing. For graphene/ethyl cellulose inks reported to date, the polymer component appears to be a dominant contributor to the dispersion viscosity. Consequently, it follows that increasing the graphene content of the precursor powder offers a dual enhancement: a higher graphene concentration is achieved for the same total solids loading, and higher solids loading can be employed without exceeding the desirable viscosity range. To confirm this, a graphene ink was prepared using a 50% wt. graphene/ethyl cellulose powder, with a total solids loading of about 4% w/v, yielding a total graphene concentration of about 20 mg/mL at a viscosity of about 10-about 15 mPa·s. By contrast, as discussed above, an ink based on 15% wt. graphene/ethyl cellulose powder exhibited a similar viscosity at 2.4% w/v solids loading, with a total graphene concentration of ~3.4 mg/mL. In this manner, by controlling the solids loading and graphene:polymer ratio independently, a graphene ink, suitable for inkjet printing, is ~6× more concentrated than previously demonstrated.

Figure 21A:
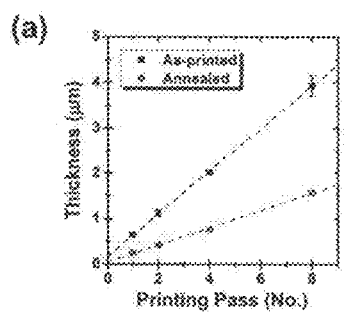
FIGS. 21A-C. Characterization of high concentration graphene inks. (A) Thickness as a function of printing passes for graphene/ethyl cellulose films as-printed and following thermal annealing. Dashed lines indicate the least squares linear fit to the thickness data, indicating a thickness per pass of 190 nm following thermal annealing. (B) Sheet resistance of graphene films at various thicknesses following thermal and IPL annealing, illustrating the suitability of IPL annealing over a broad range of film thickness. (C) Map of ink concentration and conductivity for reported non-metal conductive inkjet-printable inks, including inks based on graphene, RGO, CNTs, and PEDOT:PSS. The product of conductivity ($\sigma$) and concentration (c) is an indicator of the conductance achieved per printing pass, a key figure of merit for inkjet-printed conductors. Isolines for this metric are drawn as dashed lines to aid the eye.
Figure 21B:
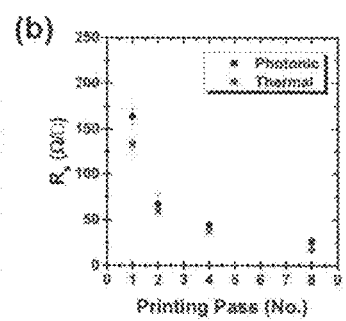

A higher graphene concentration translates into thicker films for a given number of printing passes, ultimately reducing printing time. As shown in FIG. 21A, the film thickness scales linearly with printing passes, with each additional pass adding 468±5 nm in thickness prior to annealing, or 190±6 nm in thickness following thermal annealing. As shown in FIG. 21B, the sheet resistance decreases inversely with the number of printing passes, consistent with constant bulk conductivity. The conductivity for thermally annealed samples is measured to be 25,600±900 S/m, even after a single printing pass. While the conductivity of IPL-annealed samples cannot be reliably measured due to changes in surface topography, the sheet resistance for IPL-annealed films is comparable to that of thermally annealed films, and decreases analogously for thicker films.

Altogether, such results represent another advancement in the development of graphene inks for flexible printed electronics. IPL annealing allows rapid post-processing of graphene patterns, compatible with high-throughput roll-to-roll processing on a range of substrates. The combination of unprecedented graphene loading and high conductivity achieved for this ink offers a new route for high performance, printed electronics with clear advantages over competing graphene inks as well as other non-metal conductors, e.g., reduced graphene oxide (RGO), carbon nanotubes (CNTs), and poly(3,4-ethylenedioxythiophene) polystyrene sulfonate (PEDOT:PSS). A figure of merit for practical applications is the conductance achieved per printing pass, which scales with the product of ink concentration and film conductivity. A range of competing conductive inkjet-printable inks is mapped out on axes of ink concentration and conductivity in FIG. 21C, taken from the recent literature for graphene, PEDOT:PSS, RGO, and CNTs. The dashed lines represent isolines of the product of conductivity and ink loading. A graphene ink of the present invention exhibits both high solids loading (20 mg/mL) and excellent conductivity (25,600±900 S/m), with the product exceeding the value not only for competing graphene inks but also alternative inkjet-printed, non-metal conductors. Moreover, graphene presents a number of additional desirable attributes, including robust chemical and environmental stability, reliable printability, and a well-defined chemistry without the need for harsh post-processing.

Such electrical properties, coupled with the intrinsic flexibility of graphene, motivate the application of graphene inks in flexible electronic circuitry. However, characterization of the mechanical properties of IPL-annealed graphene films is a matter of preliminary concern. While mechanical testing has been extensively performed for related graphene/ethyl cellulose inks following thermal annealing, the fundamentally different conditions of IPL annealing can lead to distinct mechanical properties. Indeed, films that are IPL annealed at high pulse energies exhibit different film morphologies from thermally annealed films. (See examples, below.) A similar effect has been previously observed for metal nanoparticles sintered by IPL annealing, and is attributed to the extreme temperatures and heat gradients induced by the process. In addition, although it is performed in ambient conditions, the rapid nature of IPL annealing can prevent oxidative processes, an effect widely exploited for processing copper-based inks. Because oxygen is typically involved in thermal decomposition of ethyl cellulose, this effect could alter the fundamental nature of the annealing process.

To investigate the mechanical behavior of IPL-annealed graphene patterns, and thus confirm their suitability for flexible interconnects, several bending tests were performed. Specifically, graphene is inkjet-printed onto PEN and processed by IPL annealing at two different pulse energies to produce conductive patterns. The electrical resistance of these stripes is measured over 1000 bending cycles to radii of curvature of 8.1 and 1.3 mm, as shown in FIGS. 22A-B. For the large radius of curvature, there is little discernible evolution of the line resistance. For the small bending radius test, the lower pulse energy produced lines with no deterioration upon bending, while the higher energy light pulse yielded lines with modest deterioration, exhibiting ~10% increase in resistance after 1000 bending cycles.

As shown by the preceding and in more detail by the following examples, graphene is an attractive material for printed electronics, offering a chemically stable, mechanically flexible, and electrically conductive alternative to conventional metal nanoparticle and conductive polymer inks. The ink formulation, printing method, and rapid IPL annealing approach provided herein overcome several limitations of graphene inks to date, and is well suited for rapid, roll-to-roll fabrication of graphene patterns on myriad flexible, bendable, substrates. Furthermore, the present advances in ink formulation can be leveraged to produce highly concentrated inkjet-printable graphene inks, with a solids content up to about 4% w/v or more and a graphene concentration up to about 20 mg/mL or more. Overall, the high solids concentration, combined with the excellent conductivity of ~25,000 S/m achieved after a single printing pass, establishes such graphene inks as leading candidates for printed, flexible electronics.

More generally, this invention provides a graphene ink from a graphene/EC powder produced using only room temperature processing methods. The graphene/EC powder allows for careful tuning of the ink to achieve stable inkjet printing of features on a variety of substrates with excellent morphology, and can be applied to other printing techniques in a straightforward manner. In addition, the conductivity of printed features following mild annealing is over two orders of magnitude better than previously reported for inkjet-printed graphene despite a smaller flake size, indicating efficient flake-flake charge transport. Such results are believed enabled by a synergistic EC binder for graphene exfoliation, which reduces flake-flake junction resistance upon annealing relative to graphene films containing residual solvent or surfactant. Finally, low processing temperatures enable compatibility with flexible substrates, thereby allowing demonstration of the high tolerance of printed graphene features to bending stresses. With this unique combination of attributes, the graphene-based inks of this invention can find utility in a wide range of printed, flexible, and/or foldable electronic applications.

EXAMPLES OF THE INVENTION

The following non-limiting examples and data illustrate various aspects and features relating to the methods and/or compositions of the present invention, including the preparation and use of concentrated graphene solutions, graphene ink compositions and related composites, as are described herein. In comparison with the prior art, the present methods provide results and data which are surprising, unexpected and contrary thereto. While the utility of this invention is illustrated through the use of several graphene dispersion agents and hydrophilic organic solvents, together with several hydrophobic fluid components which can be used therewith, it will be understood by those skilled in the art that comparable results are obtainable with various other dispersion agents and hydrophilic or hydrophobic solvents, as are commensurate with the scope of this invention.

Example 1a

Exfoliation and Sedimentation Processing of Graphene.

2.5 g of natural graphite flake (3061 grade, Asbury Graphite Mills) was added to 50 mL of 1% w/v ethyl cellulose (EC) (Aldrich) ethanol (EtOH) solution inside a plastic 50 mL centrifuge tube (note that Aldrich does not explicitly provide the molecular weight of its EC; rather, the viscosity is specified (e.g., 4 cP) when the EC is loaded at 5% w/v in 80:20 toluene:ethanol). Two tubes containing this mixture were simultaneously sonicated in a Bransonic 3510 tabletop ultrasonic cleaner for 3 hr at 40 kHz and 100 W. In order to efficiently sediment out the graphite flakes, the centrifugation was performed in a two-step process. First, the sonicated graphene dispersions were centrifuged in a large volume centrifuge (Beckman Coulter Avanti J-26 XP Centrifuge) for 10 min at 7,500 rpm to remove the fast sedimenting graphite flakes. The supernatant was then decanted from each 50 mL centrifuge tube and combined. A second sedimentation step was then performed on this combined solution in two 250 mL tubes for 4.5 hr at 7,500 rpm or an average relative centrifugal force (RCF) of 6,804 g.

Example 1b

Thermal Stability of Polymer Enhanced Graphene Dispersions.

Experiments were undertaken to highlight the thermal stability of EC-based graphene dispersions, of the sort discussed above, especially in comparison to traditional surfactant-based dispersions. Here, graphene dispersions in 1% w/v EC-EtOH and 1% w/v sodium cholate-water (SC—$H_2O$, prior art) were produced using the sonication and centrifugation procedures detailed above. Both dispersions were then concentrated to ~1 mg/mL via thermal evaporation.

At elevated temperatures, graphene flakes in the SC-based dispersion agglomerate rapidly to form precipitates, while the EC-based dispersion remains well dispersed. To quantify their thermal stabilities, both concentrated dispersions were diluted to 0.1 mg/mL and centrifuged at 15,000 rpm for 1 min. The UV-vis absorbance spectra for their supernatants were then obtained. Using the same absorbance coefficient discussed above (2460 L/gm at 660 nm), it was determined that 97.7% of the graphene remained suspended in the EC-EtOH medium, while only 18.1% remained suspended in the SC—$H_2O$ solution. The stability of these polymer-based graphene dispersions can be exploited in subsequent post-synthetic processing.

Example 1c

Enhanced Graphene Production Efficiency in DMF.

Improvement in graphene production is also demonstrated by adding EC to dimethylformamide (DMF), which has moderate intrinsic graphene solubility. In this case, natural graphite was bath sonicated for 3 h at 50 mg/mL in both DMF and 1% w/v EC-DMF. After centrifugation at 7500 rpm for 4.5 h to remove the thick graphite flakes, UV-vis absorbance spectra were taken to assess their graphene concentrations (FIG. 1C).

Using an absorbance coefficient of 2460 L/g·m at 660 nm, the graphene concentration for the DMF and EC-DMF dispersions were determined to be 14.1 and 82.8 μg/mL, respectively. (See, Hernandez, Y.; Nicolosi, V.; Lotya, M.; Blighe, F. M.; Sun, Z.; De, S.; McGovern, I. T.; Holland, B.; Byrne, M.; Gun'Ko, Y. K.; Boland, J. J.; Niraj, P.; Duesberg, G.; Krishnamurthy, S.; Goodhue, R.; Hutchison, J.; Scardaci, V.; Ferrari, A. C.; Coleman, J. N., *Nat. Nanotechnol.* 2008, 3, 563-568). It follows that, the addition of 1% w/v EC to DMF yielded a 5.9-fold improvement in the graphene exfoliation/production efficiency. Overall, improving the graphene exfoliation efficiency in organic solvents with moderate to high intrinsic graphene solubilities can both reduce material waste and benefit printed electronic and related applications where higher graphene-to-dispersant ratios are required.

In accordance with this invention, without limitation, various other $C_2$-$C_5$ alcohols, esters, ethers, ketones and amides can be used, in conjunction with a cellulosic polymer, to suspend and exfoliate graphene.

Example 2

Graphene Concentration Via Iterative Solvent Exchange.

To ensure proper hydrophobic phase separation, water, in excess of four times the volume of the starting graphene solution, is added. A brief sonication step, of approximately 1 min, is also performed after each graphene concentration and graphene addition step to facilitate phase separation and solution mixing.

Example 3

$SiO_2$ Graphene Deposition.

Graphene flakes from both the sedimented graphene solution and third-iteration concentrated graphene solution were deposited onto 100 nm thick oxide silicon wafers for imaging. The wafers were first submerged in 2.5 mM 3-aminopropyl triethoxysilane aqueous solution to functionalize the surface with a hydrophobic self-assembling monolayer for 30 min. The substrates were then rinsed with water and dried under a stream of $N_2$. Both graphene solutions were then diluted to approximately 0.02 mg/mL in ethanol after which a drop of each was placed onto the functionalized wafers for 10 min. The drops were then blown off under a stream of $N_2$, and the wafer was rinsed with water. To remove the residual EC, the wafers were annealed for 20 min at 400° C. in air.

Example 4

Atomic Force Microscopy Thickness Measurements.

Figure 3A:
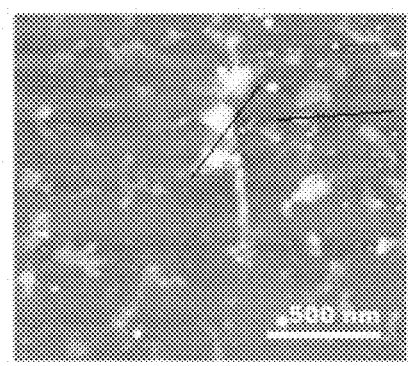
FIGS. 3A-B. (A) Digital AFM image of graphene flakes deposited on $SiO_2$. (B) Line scan profiles of two deposited graphene flakes, with the larger flake exhibiting edge folding.
Figure 3B:
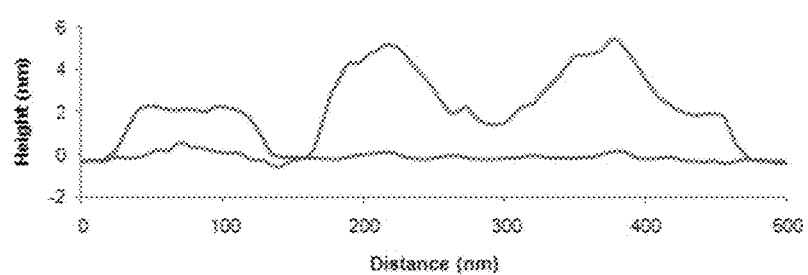

All atomic force microscopy (AFM) images were obtained using a Thermo Microscopes Autoprobe CP-Research AFM in tapping mode using cantilever B on Mikro-Masch NSC NSC36/Cr—AuBS probes. 2 μm×2 μm images were collected using identical scanning parameters. Flake thicknesses were determined using line-scan thickness profiles across flakes larger than 5,000 nm$^2$ while avoiding regions where EC residues were present. (FIG. 3) 146 flakes were analyzed on the wafer deposited with the sedimented graphene solution, and 156 flakes were analyzed for the wafer deposited with the third-iteration concentrated graphene solution.

Example 5

Thin Film Deposition.

Graphene-EC and graphene thin films were blade coated from concentrated graphene inks onto glass slides using either 1 or 2 layers of 3M Scotch Magic Tape (about 30-about 40 μm per layer) as masks. In order to optimize ink rheology for uniform film deposition, 10% w/v EC (Aldrich, 22 cP, 5% in toluene:ethanol 80:20) in ethanol was added to the graphene ink. The modified graphene ink was deposited into 2 cm×2 cm squares on 2.54 cm×2.54 cm silica glass slides. To obtain films with different optical densities, select films were also spun at 10,000 rpm for 3 min. These films were then allowed to dry overnight, and the mask was removed to obtain a transparent graphene-polymer film (not shown). Graphene thin films require an additional annealing step, performed for 30 min at 400° C. in air, to remove the EC and enhance flake-to-flake contact. After annealing, these graphene thin films were rinsed in acetone before optical transmittance and four point probe measurements.

Example 6

Optical Absorbance and Transmittance Measurement.

Figure 4:
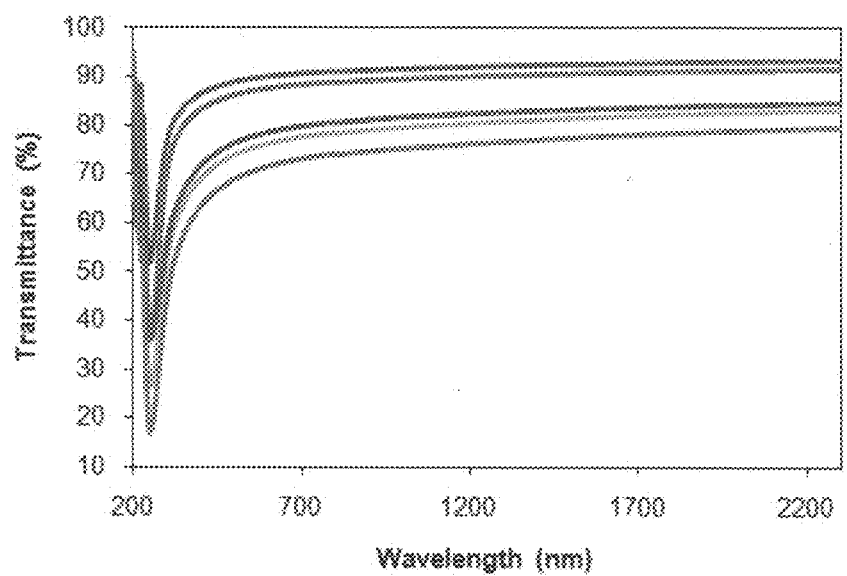
FIG. 4. Optical transmittance spectra for the five graphene conductive films analyzed.

Optical absorbance measurements to determine graphene solution concentrations and transmittance measurements for transparent conductive graphene thin films were performed using a Varian Cary 5000 spectrophotometer. Background from the optical cuvette, EC-ethanol solution, and glass slide were subtracted from the spectra of the graphene dispersions and films. Due to their high absorbance, concentrated graphene solutions were diluted either 4× or 10× to ensure that the optical absorbance was within the detector limits. As expected, the graphene thin films of the preceding example provide featureless optical absorbance spectra with high transparency at visible and infrared wavelengths (FIG. 4).

Example 7

Raman Spectroscopy of the Graphene Films.

Figure 5:
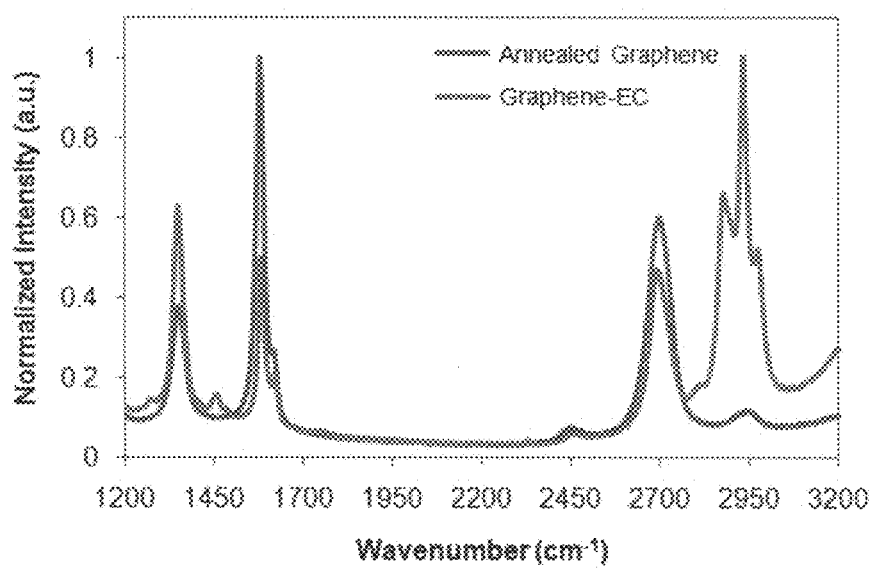
FIG. 5. Representative Raman spectra of the annealed graphene thin film and graphene-EC nanocomposite. These spectra were obtained by combining five individual spectra from different locations of each film and with the intensity of the highest peak normalized to unity.

Raman spectroscopy was obtained using a Renishaw inVia Raman microscope with an excitation wavelength of 514 nm. Five spectra were obtained on different areas of the annealed graphene film and the graphene-EC nanocomposite using a beam size of 1-2 μm, allowing multiple flakes to be probed in each measurement. These spectra showed minimal variation across different locations and were combined to form a representative Raman spectrum for the entire film (FIG. 5). Typical Raman spectra for the annealed graphene film exhibit four primary peaks: the G band at ~1,590 cm$^{-1}$, 2D band at ~2,700 cm$^{-1}$, and the disorder-associated D and D' bands at ~1,350 cm$^{-1}$ and ~1,620 cm$^{-1}$ respectively. The intensity ratio of the D and G bands, I(D)/I(G), is a measure of the level of defects that are introduced during the sonication and annealing processes. The I(D)/I(G) value for the annealed graphene film was ~0.38, significantly less than reported values for surfactant exfoliated graphene solutions with a similar size distribution (~0.93) (see, Green, A. A.; Hersam, M. C.; *Nano Lett.* 2009, 9, 4031-4036) and heavily reduced graphene oxide (~0.82) (Gao, W.; Alemany, L. B.; Ci, L.; Ajayan, P. M. *Nature Chem.* 2009, 1 (5), 403-408) but higher than that for larger-sized solvent exfoliated graphene flakes. (See, Hernandez, Y.; Nicolosi, V.; Lotya, M.; Blighe, F. M.; Sun, Z.; De, S.; McGovern, I. T.; Holland, B.; Byrne, M.; Gun'Ko, Y. K.; Boland, J. J.; Niraj, P.; Duesberg, G.; Krishnamurthy, S.; Goodhue, R.; Hutchison, J.; Scardaci, V.; Ferrari, A. C.; Coleman, J. N. *Nat. Nanotechnol.* 2008, 3, 563-568.) The measured value of ~0.38 indicates that large quantities of defects or oxidation were not introduced during exfoliation and annealing.

Example 8

Nanocomposite Fracture Surface.

Figure 6:
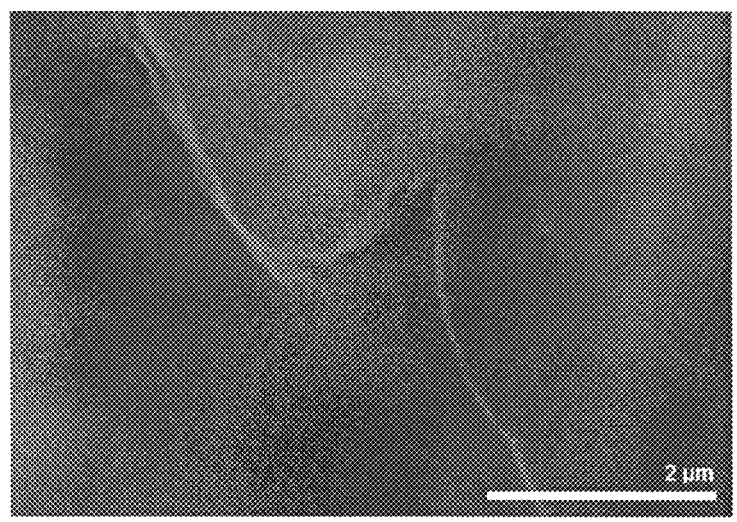
FIG. 6. Digital SEM image of an EC film fracture surface without graphene. The absence of the fracture terraces, in contrast to those observed in FIG. 2B, indicates that the anisotropic fracture behavior of the EC-graphene nanocomposite results from aligned graphene flakes.

The graphene-EC and graphene-free EC films were fractured using shearing forces applied orthogonally to the planes of the films. The fractured surfaces were then analyzed using SEM to gauge the adhesion strength of graphene to EC and orientation of graphene flakes. (See, FIG. 6.)

Example 9

Scanning Electron Microscopy.

Scanning electron microscopy of the transparent conductive graphene thin films and fracture surfaces of graphene-EC nanocomposites was performed on a Hitachi 4800 scanning electron microscope using a 1 kV accelerating voltage.

Example 10

Figure 7A:
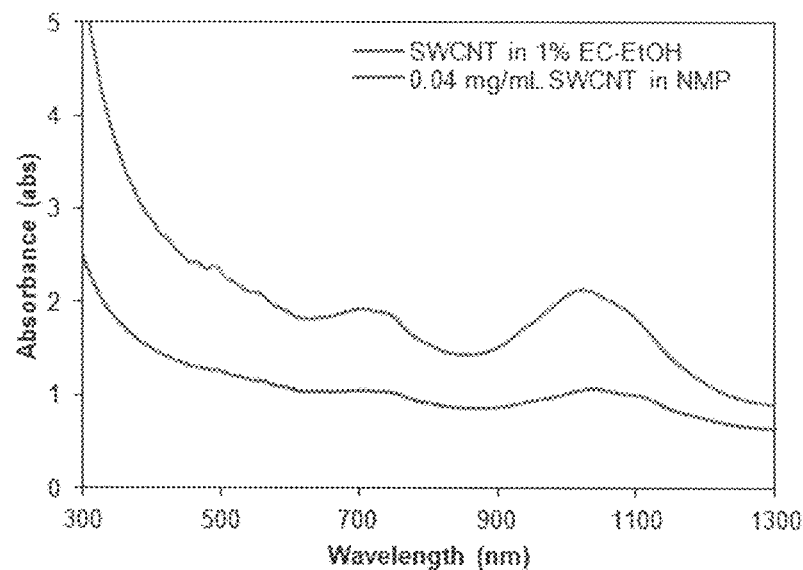
FIGS. 7A-B. (A) absorbance spectra for dispersions of single-walled carbon nanotubes, showing enhanced debundling and concentration using ethyl cellulose-ethanol (upper plot), in accordance with this invention. (The reference dispersion also illustrates the utility of methylpyrrolidone as an organic solvent component, in accordance with this invention.) (B) a digital SEM image of an annealed SWCNT thin film.
Figure 7B:
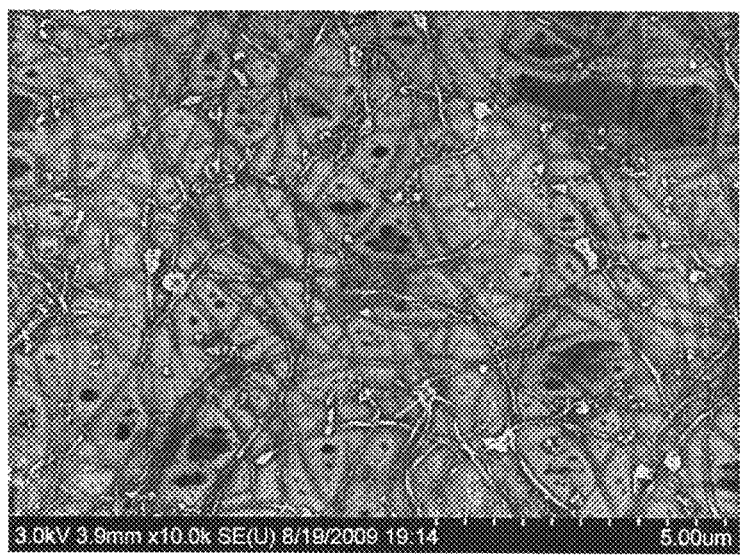

Dispersion and iterative solvent exchange can be used concentrate fluid media comprising other nanodimensioned materials, such as single-walled carbon nanotubes, using procedures analogous to those described in examples 1-2. For instance, single walled carbon nanotubes (SWCNTs) were dispersed in 1% EC-EtOH via 1 h horn sonication and 4.5 h centrifugation at 7500 rpm. Compared to a reference 0.04 mg/mL SWCNT/N-methylpyrrolidone (NMP) dispersion, without EC, the concentration of the 1% EC-EtOH dispersion was determined to be around 0.75 mg/mL (see, FIG. 7A). Solvent exchange with terpineol provided a concentrated SWCNT-EC ink. Likewise, substrate deposition and material characterization can be accomplished, using techniques of sort described in examples 3-9. A transparent SWCNT thin film was prepared by blade coating and annealing the aforementioned ink at 400° C. in air for 30 minutes. An SEM image of the annealed SWCNT thin film is shown in FIG. 7B.

Example 11

Solvent Exfoliation and Processing of Graphene.

10.0 g natural graphite flake (Asbury Graphite Mills, 3061 Grade) was dispersed in a solution of 200 mL, 2% w/v ethyl cellulose (EC) in ethanol (EC: Aldrich, viscosity 4 cP, 5% in toluene/ethanol 80:20, 48% ethoxy; ethanol: Koptec, 200 proof) in a stainless steel beaker. The dispersion was sonicated using a probe sonication system (Fisher Scientific Sonic Dismembrator Model 500, 13 mm Branson tip) for 90 minutes at 50 W in an ice water bath. The resulting dispersion was centrifuged (Beckman Coulter Avanti® J-26 XPI) at 7,500 rpm (~10,000 g) for 15 minutes, and the supernatant was collected. To this dispersion, a 0.04 g/mL aqueous solution of NaCl (Sigma-Aldrich, >99.5%) was added in a 1:2 volume ratio. The resulting mixture was centrifuged at 7,500 rpm for 8 minutes, after which the supernatant was removed. The resulting graphene/EC solid was dried, dispersed in ethanol, and passed through a 5 µm sieve (Industrial Netting, BS0005-3X1) to remove any large particles that might compromise inkjet printing. The dispersion was then flocculated again, with the same parameters as above. To remove any residual salt, the resulting graphene/EC solid was washed with deionized water and isolated by vacuum filtration (Millipore Nitrocellulose HAWP 0.45 µm filter paper). This isolated graphene/EC product was then dried, yielding a fine black powder. (Related graphene exfoliation and concentration procedures, with alternate ordering of steps and/or techniques, are as described in the aforementioned co-pending '608 application, the entirety of which is incorporated herein by reference.)

Example 12

Atomic Force Microscopy (AFM) Characterization of Graphene Flakes.

For graphene flake characterization, a sample of graphene/EC dispersion in ethanol was deposited onto Si/SiO$_2$ for AFM characterization. Prior to sample deposition, Si/SiO$_2$ wafers were immersed in 2.5 mM 3-aminopropyl triethoxysilane (Aldrich, 99%) in 2-propanol (Macron Chemicals, 99.5%) for 30 minutes, after which they were rinsed with 2-propanol and blown dry under a stream of N$_2$. A diluted graphene dispersion was dropcast onto the wafers and left for 10 minutes, after which it was blown dry with N$_2$ and rinsed with 2-propanol. To remove ethyl cellulose and residual 3-aminopropyl triethoxysilane, the samples were annealed at 400° C. in a tube furnace for 30 minutes. AFM images were obtained using a Bruker ICON PT AFM System in tapping mode with a Veeco Model RTESP (MPP-11100-10) cantilever. The images were collected with 2 µm×2 µm scans, and particle characteristics were determined using Nanoscope Analysis software. Flake thickness was determined from line scans, and flake area was measured automatically using the software. Flake thickness was measured for 355 flakes, and flake area was measured for 216 flakes. (See FIGS. 9A-C.)

Example 13

Thermal Gravimetric Analysis (TGA) of Graphene/EC Powder.

Powder samples of pure ethyl cellulose and graphene/EC powder were analyzed using a Mettler Toledo TGA/SDTA851 system at a heating rate of 5° C./min in air. (See FIGS. 10A-B.)

Example 14

Si/SiO$_2$ Surface Modification.

Surface modification of Si/SiO$_2$ wafers with hexamethyldisilazane (HMDS, Aldrich, >99%) employed a vapor treatment technique. Si/SiO$_2$ wafers were cleaned by bath sonication in ethanol for 20 minutes followed by 5 minutes O$_2$ plasma treatment (Harrick Plasma, Plasma Cleaner PDC-001). The wafers were then suspended over a dish of HMDS in a contained vessel for 30 minutes, while the HMDS vapor coated the surface. The wafers were then rinsed with 2-propanol and dried under a stream of N$_2$. The resulting water contact angle was ~66°.

Example 15

Ink Preparation and Printing.

To prepare the ink for inkjet printing, graphene/EC powder was dispersed in an 85:15 cyclohexanone/terpineol mixture at a concentration of 2.4 wt % by bath sonication. The resulting ink was passed through a 0.45 µm filter (Pall Acrodisc® CR 25 mm syringe filter, 0.45 µm PTFE Membrane) to remove any dust or contaminants that could destabilize printing. The ink was printed using a Fujifilm Dimatix Materials Printer (DMP-2800) equipped with a 10 pL drop cartridge (DMC-11610). The images of drop formation were captured using the built-in camera of the printer (FIG. 8F). The shear viscosity of the ink was measured using a Physica MCR 300 rheometer equipped with a 50 mm cone and plate geometry at shear rates of 10-1000 s$^{-1}$. The temperature was controlled by a Peltier plate for viscosity measurements at 25, 30, 35 and 40° C. to evaluate the optimal printing temperature. The printing was carried out at 30° C., for which the viscosity was 10-12 mPa·s at shear rates of 100-1000 s$^{-1}$ (FIG. 11). The surface tension was estimated to be ~33 mN/m by the drop weight method. Calibration solvents included 2-propanol, ethanol, deionized water and ethylene glycol.

Example 16

Scanning Electron Microscopy Characterization of Printed Features.

Scanning electron micrographs of printed features following 250° C. and 450° C. annealing were obtained on a Hitachi SU8030 Field Emission SEM. (See FIGS. 14A-D.)

Example 17

Annealing Study of Graphene Films.

An ink containing graphene/ethyl cellulose in ethanol/terpineol was prepared for blade-coating films. Graphene/ethyl cellulose powder (~100 mg) was dispersed in 2 mL of 4:1 ethanol/terpineol v/v by bath sonication. This ink was blade-coated onto glass slides (VWR Micro Slides) into a 15×15 mm$^2$ film defined by a mask of scotch tape. The sample was then annealed in a tube furnace (Thermo Scientific, Lindberg Blue M). The sheet resistance of the resulting film was measured by a 4-point probe technique, employing the appropriate geometric correction factors, while the film thickness was measured by profilometry (Dektak 150 Stylus Surface Profiler). These results were used to calculate the resistivity plotted in FIG. 13A-B.

Example 18

Electrical Characterization of Printed Features.

For electrical characterization, the printed graphene lines were annealed at 250° C. for 30 minutes. The line resistance was measured with Au probes. It was verified that the line resistivity did not vary with measured line length, indicating that these probes introduced a negligible contact resistance. The length of the lines was measured using optical microscopy, such that the distance between the probes was used for the line length and not the total length of the printed line.

The line resistance was measured for six lines for each data point to provide error bars. The line thickness and width were measured by AFM and used to calculate resistivity of the printed features. For the line thickness data (FIG. 13D), the average thickness over the center 50% of the line was taken as the line thickness.

Example 19

Flexibility Assessment.

For printing on flexible substrates, polyimide (DuPont Kapton®, 125 µm) was cleaned prior to use by bath sonication in ethanol for 20 minutes. Graphene lines were printed on the polyimide with six printing passes using the same printing parameters as before. For electrical tests over many bending cycles (FIG. 15A), 30 mm lines were used to enable handling while also ensuring that a larger proportion of the line was subject to mechanical stress. For the electrical measurements in a flexed state (FIGS. 15B-D), 60 mm lines were used to enable the experimental setup. The error bars were obtained by measuring 8 lines for FIGS. 15A-B and 12 lines for FIG. 15C.

Example 20

High Shear Mixing for the Solution-Phase Exfoliation of Graphene.

As discussed above, the production of graphene for printed electronics requires large volumes of material to expand the scope of potential applications. Conventional methods employed in academic laboratories, particularly ultrasonication, have limited scalability due to the high energy intensity required and the small process volumes. High shear mixing offers an attractive alternative with straightforward scaling to large volumes (~$m^3$) and energy-efficient exfoliation. The use of shear mixing in the production of a graphene/ethyl cellulose (EC) composite, for inkjet printing, is evaluated in FIG. 16. Higher graphene concentrations were achieved for a larger volume of dispersion using shear mixing instead of ultrasonication, while the as-produced graphene exhibited similar flake thickness and area. In conjunction herewith, shear mixing can be employed using apparatus, conditions and techniques of the sort well-known to those skilled in the art and made aware of this invention.

For instance, shear mixing was performed using a Silverson L5M-A Laboratory Mixer with a 32 mm mixing head and square hole high shear screen. 90.0 g natural graphite flake (Asbury Graphite Mills, 3061 Grade) was dispersed in a solution of 18 g ethyl cellulose (EC) in 900 mL ethanol (EC: Aldrich, viscosity 4 cP, 5% in toluene/ethanol 80:20, 48% ethoxy; ethanol: Koptec, 200 proof). The dispersion was shear mixed for 120 minutes at 10,230 rpm to produce graphene, with samples collected at intervals and centrifuged for analysis. Such a procedure can improve production rates by ~10×.

Example 21

Photonic Annealing of Graphene Patterns.

Thermal annealing of a graphene/EC material can reduce applicability with respect to some plastic substrates with low glass transition temperatures. Photonic annealing, on the other hand, presents an alternative annealing strategy compatible with a broader range of substrates. By applying a rapid, intense light pulse, the graphene/EC material is selectively heated due to its strong optical absorption while the transient nature of the pulse limits the heating of the substrate. To optimize the effectiveness of photonic annealing, graphene/EC films were printed with a high graphene content (e.g., ~65% wt.). The sheet resistance of the films following thermal and photonic annealing was measured for a range of annealing conditions. As shown in FIG. 17, photonic annealing yields a sheet resistance approximately 4× greater than that resulting from optimized thermal annealing, while maintaining compatibility with plastic substrates limited to a maximum temperature of approximately 150° C. Such results show that process limitations relating to thermal annealing of a graphene/EC material can be mitigated. In conjunction herewith, photonic annealing can be employed using apparatus, conditions and techniques of the sort well-known to those skilled in the art and made aware of the present invention.

To illustrate photonic annealing, graphene/EC films were inkjet-printed from an ink containing ~1.7 mg/mL graphene and ~0.85 mg/mL EC dispersed in an 85:15 mixture of cyclohexanone and terpineol. Printed films on polyethylene terephthalate (PET, DuPont Teijin Films Melinex® ST579/200) were post-processed with photonic annealation using a Xenon Sinteron 2000 pulsed light source, with a 1 ms light pulse at 2.4-3.6 kV operation. Additional films on PET were first thermally annealed at 100° C. in air prior to the same photonic annealing treatment.

Example 22a

Liquid-Phase Exfoliation and Processing of Graphene.

Graphene was exfoliated from graphite using a high shear mixer (Silverson L5M-A) with a square hole high shear screen. Ethyl cellulose (EC, Sigma-Aldrich, 4 cP grade as measured at 5% in 80:20 toluene:ethanol, 48% ethoxy) was dissolved in ethanol (Koptec, 200 proof) at a concentration of 0.2-2% w/v (Supporting Information, Figure S2), and flake graphite (Asbury Graphite Mills, Grade 3061) was added at 10% w/v. This mixture was shear mixed for 2 hours at 10,230 rpm in an ice bath, and then centrifuged at 4,000 rpm (~3,000 g) for 2 hours to sediment out large graphite flakes (Beckman Coulter Avanti® J-26 XPI centrifuge). The supernatant containing graphene, EC, and ethanol was harvested by pipette. For the flocculation step, this supernatant was mixed in a 16:9 wt. ratio with an aqueous NaCl solution (0.04 g/mL NaCl, Sigma-Aldrich, >99.5%) and centrifuged for 6 min at 7,500 rpm (~10,000 g) to sediment the graphene/EC composite. This sediment was washed with deionized water, collected by vacuum filtration (Millipore Nitrocellulose HAWP 0.45 µm filter paper), and then dried to yield the graphene/EC powder, with a graphene content of 25-65% wt. depending on the starting EC loading.

Example 22b

The graphene flakes produced by this method were analyzed using atomic force microscopy to characterize both flake thickness and lateral area. Resulting histograms are shown in FIGS. 23A-B. Note that the histograms are shown for both number-weighted (each particle weighted equally) and volume-weighted (particles weighted by relative volume) statistics. While number-weighted distributions are common practice, weighting by volume provides more physically meaningful insight into the properties of inks and resulting thin films.

Example 22c

To control the graphene/EC ratio of the powders, inks, and printed films, the concentration of EC in the initial graphene exfoliation step was varied. As shown in FIG. 24A, increasing the EC concentration led to an increase in the graphene yield, with a stronger dependence than observed for tip sonication. The graphene/EC ratio of the powder was measured by thermal-gravimetric analysis (FIG. 24B), and varies from 25-65% wt. graphene for an initial EC concentration of 2.0-0.2% w/v. Importantly, much of the enhancement of the graphene ratio occurs during the flocculation step, as shown in FIG. 24C. Prior to flocculation, graphene comprises 2-10% of the total solids; the graphene composition is enhanced by ~10× during the flocculation step, enabling the high graphene content powders critical for effective intense pulsed light (IPL) annealing.

Example 23a

Ink Formulation and Preparation.

Graphene/EC powder was directly dispersed in solvents for inkjet printing by bath sonication. The solvent system used for all inks in this study is 85:15 v/v cyclohexanone/terpineol (Sigma-Aldrich). For the initial study of the effect of graphene content and substrate dependence (FIGS. 19, 20A), the inks contained 1% w/v graphene/EC powder comprised of 25% or 50% wt. graphene, as indicated. For the subsequent studies (FIGS. 20B-C, 21 and 22), the ink contained 4% w/v solids, based on a graphene/EC powder that contained 50% wt. graphene. All inks were filtered with a 3.1 µm glass fiber syringe filter following dispersion to prevent clogging of the inkjet nozzles. The filtered inks were briefly bath sonicated (5-10 min) prior to inkjet printing, and used over the course of 4 weeks to 6 months.

Example 23b

Graphene/EC powders were directly dispersed in solvents for inkjet printing by bath sonication. The solvent system used for all inks in this study is 85:15 v/v cyclohexanone/terpineol, because this solvent system had been shown to afford stable inkjet printing and uniform, high conductivity graphene patterns with negligible evidence of coffee ring formation and good wetting/drying characteristics on a variety of substrates. For the initial comparison of 25% and 50% wt. graphene samples (FIG. 19), appropriate powders were dispersed at 1% w/v in the inkjet printing solvent for a straightforward comparison. For the high concentration ink (FIG. 21), 50% wt. graphene powder was dispersed in the solvent at a total solids loading of 4% w/v. Following bath sonication, the ink was filtered through a 3.1 µm glass fiber filter. To confirm that the high graphene content facilitates inkjet printing at this high loading, an ink was prepared similarly with 15% wt. graphene powder (for comparison with preceding example), again at a total solids loading of 4% w/v. The viscosity of each ink was measured at 20-40° C., as shown in FIG. 25. The ink containing the enriched graphene powder exhibits a viscosity of 10-15 mPa·s, within the suitable range for inkjet printing of 8-15 mPa·s. In contrast, the ink containing the standard 15% wt. graphene powder exhibits a higher viscosity, confirming that the high polymer content imposes an upper limit on the ink loading due to the ink viscosity.

Example 24a

Inkjet Printing.

All inkjet printing for this study was accomplished with a Ceradrop X-Serie inkjet printer equipped with a 10-pL nominal drop size Dimatix cartridge (DMC-11610). Printing was performed using a custom waveform modeled after the Dimatix Model Fluid 2 waveform at 1000-2000 Hz with the inkjet nozzle plate maintained at 30° C. and the substrate held at 35° C. Printed patterns were dried at 80° C. for 60-180 min following printing to ensure complete solvent evaporation prior to annealing. Substrates for inkjet printing were obtained as follows: PET (Melinex ST579, 50 µm) and PEN (Teonex Q51, 50 µm) films were graciously supplied by DuPont Teijin Films; PI (DuPont Kapton®, 125 µm) was purchased from American Durafilm; and 1 mm thick glass slides were purchased from VWR International. HMDS-treated glass slides were prepared using a vapor treatment technique. Glass slides were cleaned with acetone and isopropanol, and then subjected to $O_2$ plasma treatment for 5 min. They were then exposed to HMDS (Sigma-Aldrich, ≥99%) vapor at room temperature for 30 min, after which they were rinsed with isopropanol and dried under a $N_2$ stream. All other substrates were used as received. For the data presented in FIGS. 19 and 20A, the thickness of the graphene films corresponds to ~80 nm following thermal annealing.

Example 24b

Figure 26:
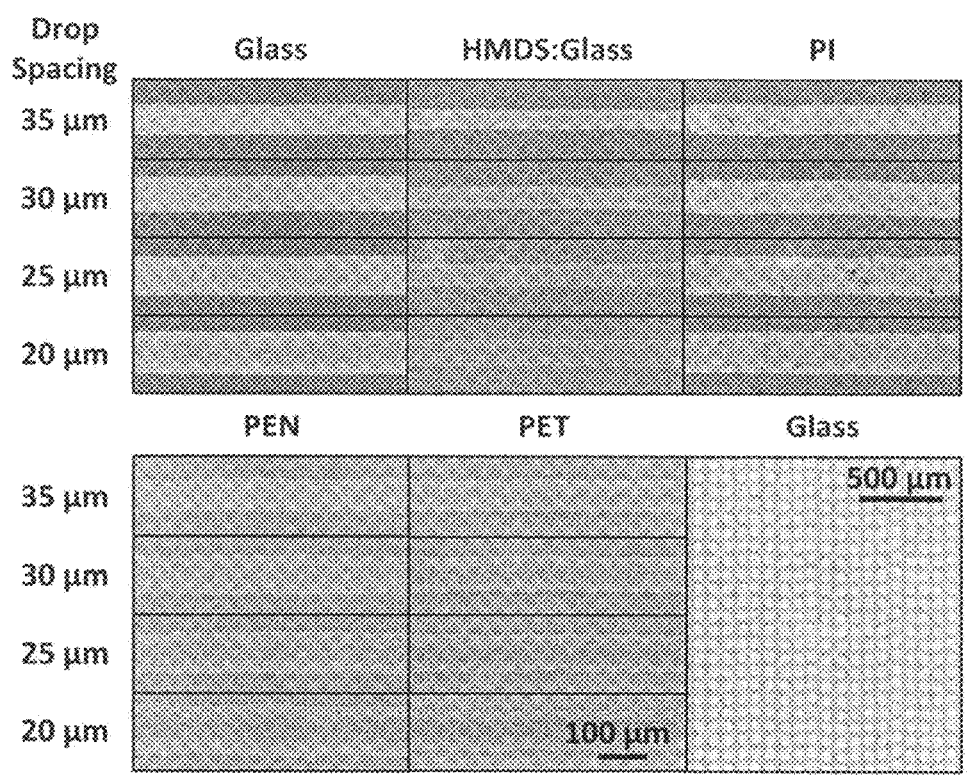
FIG. 26. Characterization of inkjet-printed graphene patterns. Optical images of printed lines with different drop spacing on various substrates, including untreated glass, HVDS-treated glass, PI, PEN, and PET. (bottom right) Printed drop array on untreated glass, showing stable and reproducible jetting and wetting performance. The direction of printing is oriented vertically in this image.
Figure 27A:
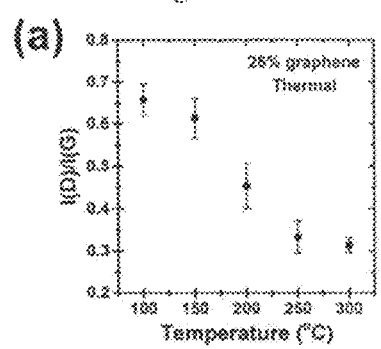
FIGS. 27A-D. Evolution of the Raman D-to-G band intensity ratio for 25% wt. (A,B) and 50% wt. (C,D) graphene films as a result of thermal (A,C) and IPL (B,D) annealing.
Figure 27B:
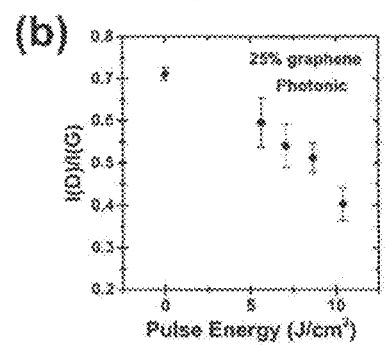
Figure 27C:
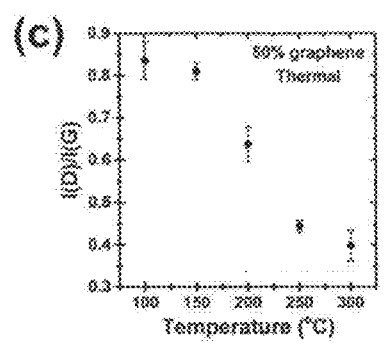
Figure 27D:
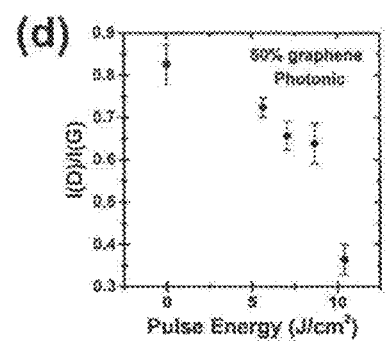

The high concentration graphene ink was printed onto five different surfaces to assess the wetting/drying characteristics of the ink. To confirm that good resolution can be achieved on a range of substrates, lines were printed with a drop spacing of 20-35 µm (FIG. 26). As expected, the line width decreases for increasing drop spacing, with straight and uniform lines observed in each case. Notably, the observed line resolution on HVDS-treated glass is ~45 µm for a drop spacing of 35 µm, confirming that this ink can produce high resolution lines when the substrate surface energy is tuned appropriately.

Example 25

Intense Pulse Light Annealing.

IPL-annealing was performed using a Xenon Sinteron 2000 with a pulse energy of 300-1500 J (see Supporting Information for details). We note that the pulse energy indicated is the energy input of the lamp. As understood in the art, a reasonable estimate is that ~30% of the input energy is converted to radiation. For all IPL annealing experiments, the sample was held a distance of 25 mm from the lamp, and short 1 ms broad spectrum (240-1500 nm) light pulses were applied. The annealing area was 19×305 mm. In most cases (FIGS. 19B, 19D, 20A and 22), a single light pulse was used. For thick films (FIG. 21B, 2-8 layers), five light pulses were used with 5 s delay between each.

Example 26a

Characterization.

The shear viscosity of the inks was measured with an Anton Paar Physica MCR 302 rheometer equipped with a 50 mm, 1° cone and plate geometry at shear rates of 1-1000 $s^{-1}$. The temperature was controlled by a Peltier plate. Printed line resolution measurements (FIGS. 20B-C) were obtained using an Olympus optical microscope, with the average and standard deviation plotted for 10 measurements at each condition. All electrical measurements were collected using a Keithley source meter. Film samples (FIGS. 19-21) were characterized using an in-line 4-point probe measurement system, taking into account appropriate geometric correction factors. Line samples (FIG. 22) were analyzed using a two-probe measurement. Raman spectra were obtained using a Horiba Xplora Raman microscope equipped with a 532 nm laser. Peak intensity ratios indicate the average and standard deviation of 5 different spectra collected at different points. Note that a low laser power and long integration time were employed to avoid altering the sample from local heating. Measurements of the film thickness (FIG. 21A) were collected on inkjet-printed films on glass using a Dektak 150 Stylus Surface Profiler.

Example 26b

As mentioned above, graphene films were characterized by Raman spectroscopy following both thermal and IPL annealing. In particular, the evolution of the D-to-G band intensity ratio was measured for a range of annealing conditions. As shown in FIGS. 27A-D, both thermal and IPL annealing result in a similar decrease in I(D)/I(G).

Example 26c

Figure 28:
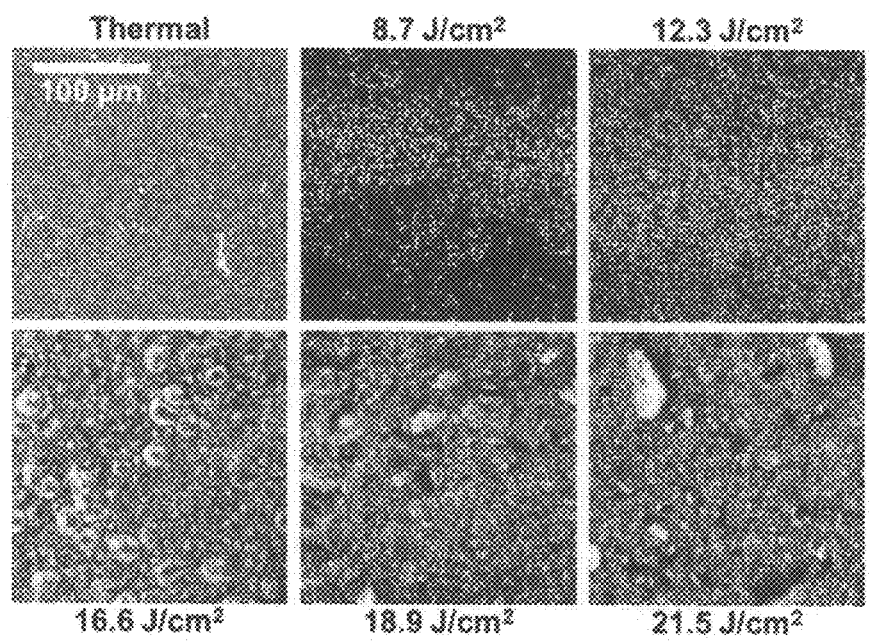
FIG. 28. Film morphology changes as a function of annealing conditions, showing dark field optical microscopy images of films on PI following thermal and IPL annealing. As the pulse energy is increased, bubbles and other defects begin to form.

Also, as mentioned above, the morphology of films processed by IPL annealing exhibits unique characteristics compared to thermal annealing, and is dependent on the annealing conditions. FIG. 28, through a series of micrographs, illustrates the morphology of films processed by different IPL annealing energies, as well as thermal annealing. At high pulse energies, some features appear including bubbles and microscale tears. Notably, though, these features do not preclude the realization of high electrical conductivity.

Example 26d

Figure 29:
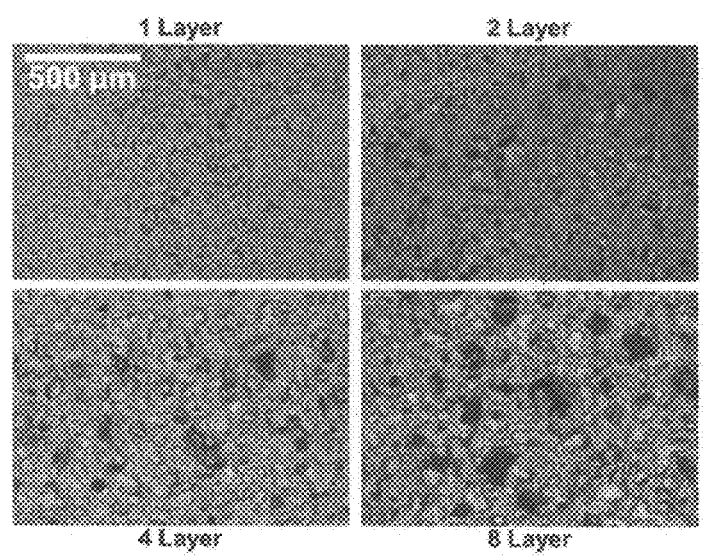
FIG. 29. Film morphology as a function of film thickness for IPL annealing at 18.9 J/cm$^2$. Thicker films exhibit features with a larger length-scale than thin films. Optimization of IPL annealing for different thicknesses.

In addition, the evolution of film morphology depends to some degree on the graphene film thickness. FIG. 29, through a series of micrographs, shows films on PI annealed with a pulse energy of 18.9 J/cm$^2$ for 1, 2, 4 and 8 printing passes. It is evident that the characteristic feature size increases with the film thickness.

Example 27

Optimization of IPL Annealing for Different Thicknesses.

Figure 30A:
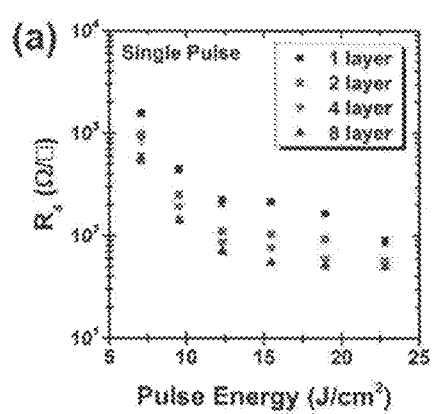
FIGS. 30A-B. Effectiveness of IPL annealing for films of different thicknesses. (A) Sheet resistance as a function of IPL annealing energy for films of varying thicknesses using a single light pulse. (B) Effect of multiple light pulses for films with one and eight printed layers, showing sheet resistance for a single 1-ms pulse and five 1-ms pulses spaced by 5 s.
Figure 30B:
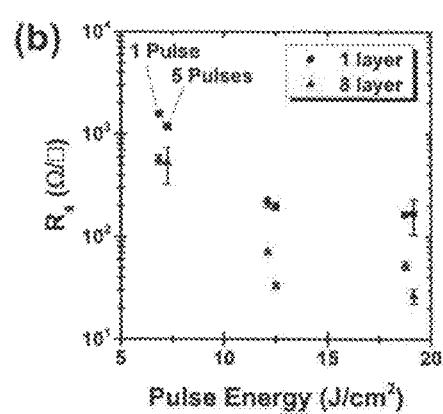

FIG. 21B shows sheet resistance for IPL-annealed films of varying thicknesses. However, while FIG. 21B shows the results for optimized conditions, these optimal parameters vary depending on film thickness. For instance, FIG. 30A shows the sheet resistance of 1, 2, 4 and 8 layer films for different pulse energies. In addition, multiple pulses are shown to be effective for thicker films, as shown in FIG. 30B. While there is little observed difference between a single light pulse and five pulses for a single printed layer, the 8-layer samples exhibit considerably better electrical properties following five light pulses.

Example 28

Non-Metal Conductive Inks Comparison.

As mentioned above, FIG. 21C maps out a broad selection of non-metal conductive inks as a function of achieved conductivity and ink concentration. Details of each data point for that plot are given in Table 1. It is important to note that the effect of film density is omitted from this comparison due to the lack of information regarding density in thin films of nanomaterials. The expected conductance per pass will scale inversely with the film density, such that low density materials will exhibit a higher conductance per pass than this analysis would suggest. This is most notable for CNTs, in which the film density can be orders of magnitude below the bulk density due to inefficient packing of CNTs in a random-network film. To confirm that such conclusions remain viable, the reported sheet resistance are compared as a function of printing passes for competitive inks.

After 8 printing passes, the graphene ink presented here achieves a sheet resistance of 26.4±4.4 Ω/□ following IPL annealing and 17.1±0.5 Ω/□ following thermal annealing. Su et al. achieve a high conductivity using weakly-oxidized graphene oxide with subsequent reduction, but with a lower ink concentration, thus requiring 30 passes to reach 25 Ω/□. (Y. Su, J. Du, D. Sun, C. Liu, H. Cheng, *Nano Res.* 2013, 6, 842.) Ha et al. use a high conductivity grade of PEDOT:PSS, achieving a sheet resistance of 45.88±1.96 Ω/□ after 8 passes. (J. Ha, J. Park, J. Ha, D. Kim, S. Chung, C. Lee, Y. Hong, *Org. Electron.* 2015, 19, 147.) With a highly concentrated carbon nanotube ink, Shimoni et al. achieve a sheet resistance of 156 Ω/□ following 6 printing passes for a deliberately nonuniform film. (A. Shimoni, S. Azoubel, S. Magdassi, *Nanoscale* 2014, 6, 1.) Aiming for a uniform CNT film, Kwon et al. realize a sheet resistance of 760 Ω/□ following 12 printing passes. (O. S. Kwon, H. Kim, H. Ko, J. Lee, B. Lee, C. H. Jung, J. H. Choi, K. Shin, *Carbon* 2013, 58, 116.) The high concentration graphene ink presented here is evidently competitive with these leading inks for each material, and even presents an advantage based solely on these quantitative metrics, in addition to the other benefits of graphene.

TABLE 1

Figure 21C:
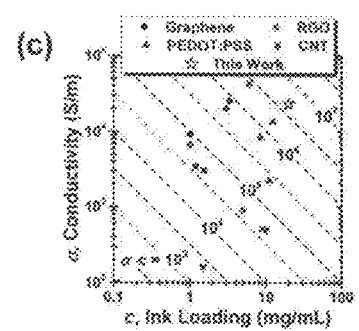

Comparison of non-metal ink characteristics from the recent literature (plotted in FIG. 21C).

| Material | σ (S/m) | | c (mg/mL) | Ref. |
|---|---|---|---|---|
| This work (graphene) | 25,600 | | 20 | — |
| Graphene | 100 | | 0.11 | [8] |
| Graphene | 3,400 | ** | 1.2 | [9] |
| Graphene | 25,000 | | 3.4 | [1] |
| Graphene | 3,000 | | 1.55 | [10] |
| Graphene | 9,240 | | 1 | [11] |
| PEDOT:PSS | 8,250 | | 8.5 | [12] |
| PEDOT:PSS | 13,400 | | 12.4 | [13] |
| PEDOT:PSS | 19,900 | * | 3 | [5] |
| PEDOT:PSS | 2,200 | | 11.1 | [14] |
| RGO | 42,000 | | 6 | [4] |
| RGO | 500 | | 9 | [15] |
| RGO | 900 | | 5 | [15] |
| RGO | 6700 | | 1 | [16] |
| CNT | 220 | * | 0.15 | [7] |
| CNT | 526 | * | 10 | [17] |

\* Calculated from reported sheet resistance and thickness data;
\*\* taken from D. Finn, M. Lotya, G. Cunningham, R. Smith, D. McCloskey, J. Donegan, J. N. Coleman, *J. Mater. Chem.* C 2014, 2, 925.

As demonstrated, above, the present invention provides a method for enhanced concentration of graphene and related nanomaterials to provide, in particular, graphene concentrations heretofore unrealized in the art. Such techniques are rapid and scalable, making more readily available the various mechanical, chemical and electronic attributes of such materials over a wide range of end-use applications.

While the principles of this invention have been described in conjunction with certain embodiments, it should be understood clearly that these descriptions are provided only by way of example and are not intended to limit, in any way, the scope of this invention. For instance, the present invention can be applied more specifically to the preparation of concentrated carbon nanotube compositions and related composite materials, using methods of the sort described herein, or in a manner as described in conjunction with use of carbon nanotubes in the aforementioned and incorporated '608 reference. Likewise, the present invention can be used in conjunction with various flexible, bendable substrates. While polyimides and polyethylene terephthalates have been described, substrates and corresponding composites can comprise and be prepared using various other flexible, bendable substrate materials, as would be understood by those skilled in the art made aware of this invention.

We claim:

1. A method of preparing an inkjet printed graphene ink composition, said method comprising:
    exfoliating a graphene source material with a medium comprising an organic solvent selected from ethanol and dimethylformamide, and an ethyl cellulose;
    contacting at least a portion of said exfoliated graphene medium with an aqueous medium to concentrate exfoliated graphene and ethyl cellulose in a solid precursor composition comprising graphene and a said ethyl cellulose;
    isolating said solid composition from said exfoliating and said aqueous media;
    contacting said solid graphene-ethyl cellulose precursor composition with a hydrophobic fluid component, to provide a graphene ink composition;
    inkjet printing said graphene ink composition on a substrate; and
    photonic annealing said graphene ink composition.

2. The method of claim 1 wherein said hydrophobic fluid comprises a component selected from terpenes, terpine alcohols and combinations thereof.

3. The method of claim 1 wherein said hydrophobic fluid component comprises a terpineol and cyclohexanone.

4. The method of claim 1 wherein said graphene ink composition has a graphene concentration of greater than about 3 mg/mL.

5. The method of claim 4 wherein said graphene ink composition has a graphene concentration of about 20 mg/mL.

6. The method of claim 5 wherein said graphene ink has a solids content of about 4% w/v.

7. The method of claim 6 wherein said graphene ink composition has a viscosity of about 8-15 mPa·sec.

8. The method of claim 1 wherein said exfoliating comprises shear mixing said graphene source material and said medium.

9. A method of preparing an inkjet printed graphene ink composition, said method comprising:
    exfoliating a graphene source material with a medium comprising an organic solvent selected from ethanol and dimethylformamide, and an ethyl cellulose to provide a precursor composition comprising graphene and a said ethyl cellulose;
    isolating said precursor composition from said exfoliating and said aqueous media;
    contacting said graphene-ethyl cellulose precursor composition with a hydrophobic fluid component, to provide a graphene ink composition comprising a graphene concentration greater than about 3 mg/mL;
    inkjet printing said graphene ink composition on a substrate; and
    photonic annealing said graphene ink composition.

10. The method of claim 9 wherein said hydrophobic fluid comprises a component selected from terpenes, terpine alcohols and combinations thereof.

11. The method of claim 9 wherein said hydrophobic fluid component comprises a terpineol and cyclohexanone.

12. The method of claim 9 wherein said graphene ink composition has a graphene ink concentration of about 20 mg/mL.

13. The method of claim 12 wherein said graphene ink has a solids content of about 4% w/v.

14. The method of claim 13 wherein said graphene ink composition has a viscosity of about 8-15 mPa·sec.

15. The method of claim 9 wherein said exfoliating comprises shear mixing said graphene source material and said medium.

16. A method of using photonic annealing to prepare a graphene ink composite, said method comprising:
    exfoliating a graphene source material with a medium comprising an organic solvent selected from ethanol and dimethylformamide, and an ethyl cellulose to provide a precursor composition comprising graphene and a said ethyl cellulose;
    isolating said precursor composition from said exfoliating and said aqueous media;
    contacting said graphene-ethyl cellulose precursor composition with a hydrophobic fluid component, to provide a graphene ink composition comprising a solids content of about 4% w/v, a graphene concentration of about 20 mg/mL and a viscosity of about 8-about 15 mPa·sec;
    inkjet printing said graphene ink composition on a substrate to provide a graphene-substrate composite; and
    photonic annealing said graphene ink composition to provide a graphene ink composition comprising a decomposition product of a said ethyl cellulose.

17. The method of claim 16 wherein said hydrophobic fluid component comprises a terpineol and cyclohexanone.

18. The method of claim 16 wherein said precursor composition comprises about 50% wt. graphene and about 50% wt. a said ethyl cellulose.

* * * * *